(12) United States Patent
Parker et al.

(10) Patent No.: US 9,964,703 B2
(45) Date of Patent: May 8, 2018

(54) INTEGRATED WAVELENGTH LOCKER

(71) Applicant: Juniper Networks, Inc., Sunnyvale, CA (US)

(72) Inventors: John Parker, Goleta, CA (US); Jared Bauters, Santa Barbara, CA (US); Jonathan Edgar Roth, San Francisco, CA (US); Erik Norberg, Santa Barbara, CA (US); Gregory Alan Fish, Santa Barbara, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days. days.

(21) Appl. No.: 15/689,319

(22) Filed: Aug. 29, 2017

(65) Prior Publication Data

US 2018/0100967 A1 Apr. 12, 2018

Related U.S. Application Data

(60) Provisional application No. 62/406,351, filed on Oct. 10, 2016.

(51) Int. Cl.
| | |
|---|---|
| *G02B 6/12* | (2006.01) |
| *H01S 5/026* | (2006.01) |
| *H04B 10/25* | (2013.01) |
| *H01S 3/067* | (2006.01) |

(52) U.S. Cl.
CPC ..... *G02B 6/12019* (2013.01); *G02B 6/12004* (2013.01); *H01S 3/06754* (2013.01); *H01S 5/0265* (2013.01); *H01S 5/0268* (2013.01); *H04B 10/25* (2013.01)

(58) Field of Classification Search
CPC .......... G02B 6/43; G02B 6/4214; G02B 6/12; G02B 6/12007; G02B 6/4246
See application file for complete search history.

(56) References Cited

U.S. PATENT DOCUMENTS

| | | |
|---|---|---|
| 4,842,358 A | 6/1989 | Hall |
| 6,385,217 B1 | 5/2002 | Singh et al. |
| 7,369,715 B2 * | 5/2008 | Darcie ................. H04B 10/032 385/1 |

(Continued)

FOREIGN PATENT DOCUMENTS

| | | |
|---|---|---|
| EP | 1028503 A2 | 8/2000 |
| WO | WO-0239553 A2 | 5/2002 |

OTHER PUBLICATIONS

"European Application Serial No. 17195791.3, Extended European Search Report dated Jan. 31, 2018", 11 pgs.

(Continued)

*Primary Examiner* — Jennifer Doan
(74) *Attorney, Agent, or Firm* — Schwegman Lundberg & Woessner, P.A.

(57) ABSTRACT

Described are various configurations of integrated wavelength lockers including asymmetric Mach-Zehnder interferometers (AMZIs) and associated detectors. Various embodiments provide improved wavelength-locking accuracy by using an active tuning element in the AMZI to achieve an operational position with high locking sensitivity, a coherent receiver to reduce the frequency-dependence of the locking sensitivity, and/or a temperature sensor and/or strain gauge to computationally correct for the effect of temperature or strain changes.

20 Claims, 16 Drawing Sheets

(56) References Cited

U.S. PATENT DOCUMENTS 8,103,178 B2 * 1/2012 McKinney ......... H04B 10/2507
398/202

OTHER PUBLICATIONS

Fedeli, Jean-Marc, et al., "Photonic-Electronic Integration With Bonding", IEEE Journal of Selected Topics in Quantum Electronics, IEEE Service Center, Piscataway, NJ, US, vol. 20, No. 4, (Jul. 1, 2014), 1-9.

* cited by examiner

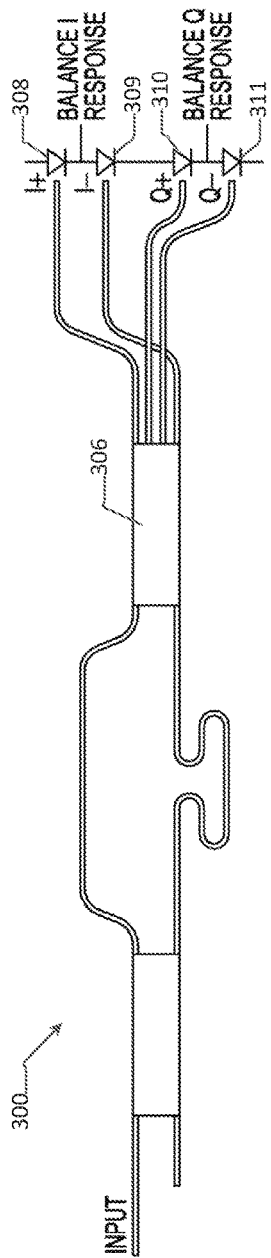
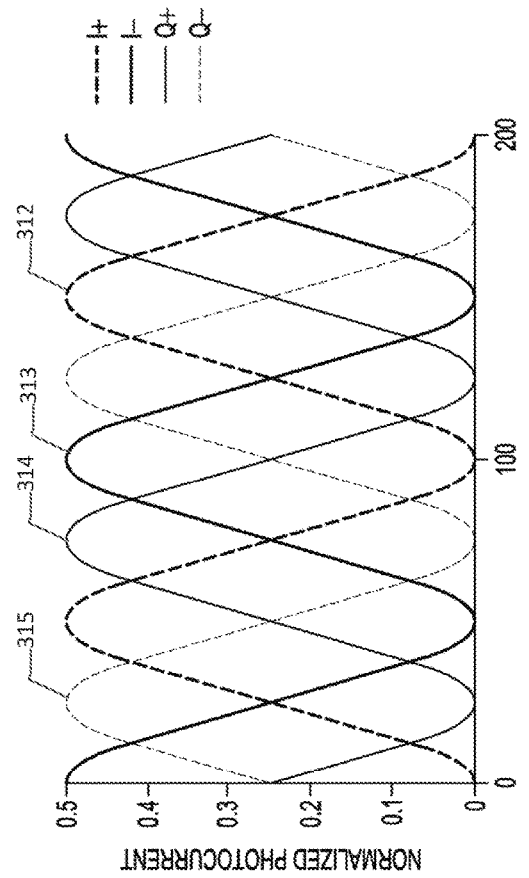
FIG. 3A
FIG. 3B

INTEGRATED WAVELENGTH LOCKER

PRIORITY

This application claims the benefit of priority to U.S. Provisional Application Ser. No. 62/406,351, filed Oct. 10, 2016, which is incorporated by reference herein in its entirety.

TECHNICAL FIELD

The p disclosure relates generally to wavelength lockers for photonic integrated circuits (PICs), and more particularly to integrated wavelength lockers.

BACKGROUND

Optical communications links often require optical wavelength alignment within a specified grid. For this purpose, bulk-optic or fiber-coupled single-etalon external wavelength lockers have been used to provide a wavelength reference; however, these external lockers tend to be expensive, have large volumes (e.g., greater than 100 mm$^3$), and limit the architecture of the PIC. Integrated wavelength lockers fabricated on-chip at the wafer-scale are highly desirable as they require less volume, can be fabricated with the other integrated photonic components at low cost in high volume, and enable functional architectures for the PIC that are more power efficient. The performance of conventional integrated wavelength lockers is, however, insufficient for many products. Fabrication variations, for example, can decrease the locking sensitivity and/or its predictability, and temperature fluctuations and strains imposed post-fabrication can reduce the locking accuracy.

BRIEF DESCRIPTION OF THE DRAWINGS

FIG. 3A is a schematic diagram of an example wavelength locker including an AMZI with a 90-degree hybrid receiver, in accordance with various embodiments.

FIG. 3B is a graph of the individual in-phase and quadrature photocurrents measured for the wavelength locker of FIG. 3A as a function of frequency, in accordance with various embodiments.

DETAILED DESCRIPTION

Figure 1:
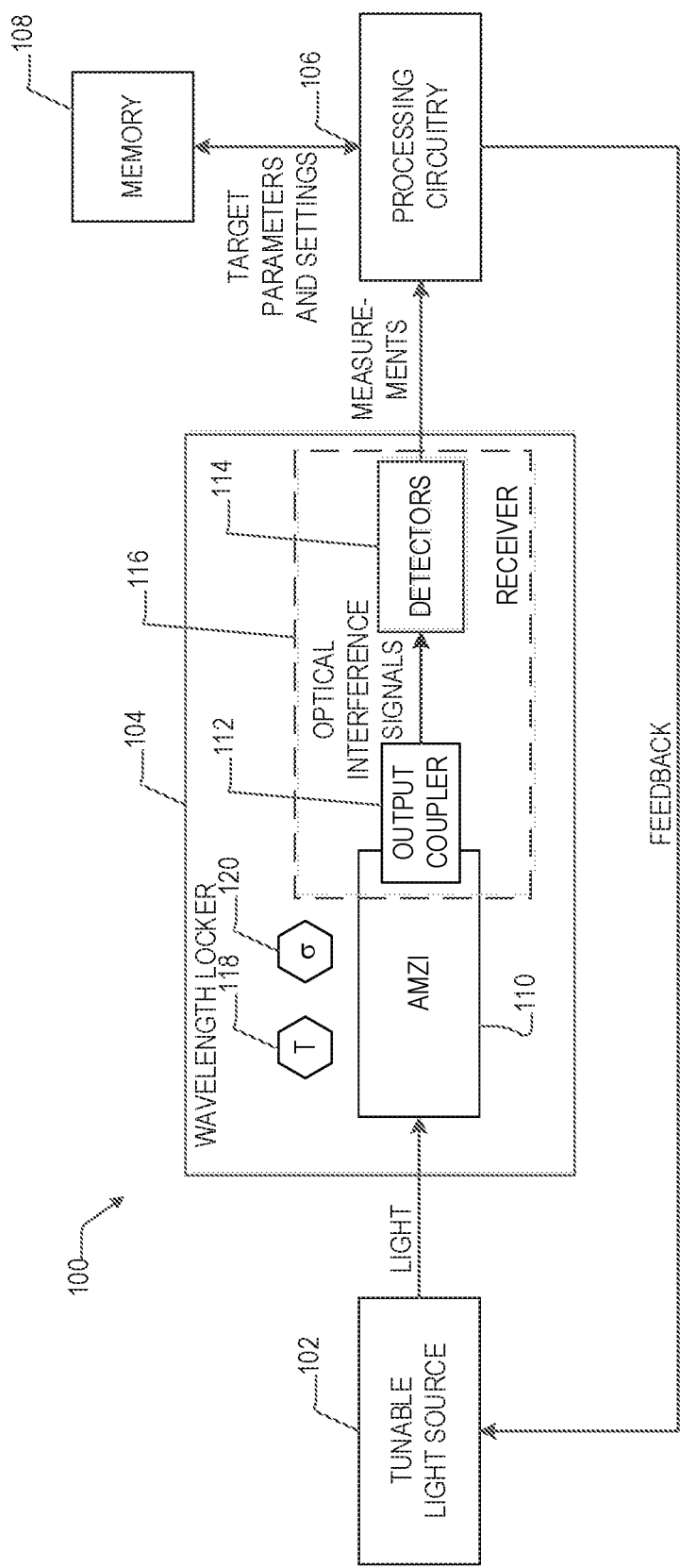
FIG. 1 is a schematic diagram of an example wavelength-locking system in accordance with various embodiments.

The present disclosure provides, in various embodiments, configurations, methods of manufacture, and methods of operation of integrated wavelength lockers that possess improved operational performance and are suitable for use across wide ambient temperature ranges and in standard packaging environments. In general, in accordance herewith, the frequency (and, thus, the wavelength) of an on-chip light source (e.g., laser or tunable light emitting diode (LED)) is "locked," that is, set to a desired "locking position," based on the periodic frequency-dependent optical response of an on-chip AMZI, as measured, e.g., with one or more photodetectors.

The sensitivity of the response at an output of the AMZI (herein also "the locking sensitivity") is generally frequency-dependent, and while the AMZI can be designed for maximum sensitivity at a given locking position (or, equivalently, locking frequency), fabrication variations can cause the frequency of maximum locking sensitivity to shift and, thus, reduce the sensitivity at the desired locking frequency. Various embodiments correct for such degradation in the locking sensitivity, achieving, in some instances, an accuracy and stability of the locking frequency corresponding to a frequency uncertainty of less than 50 GHz. In some embodiments, the integrated wavelength locker includes a heater or other active tuning element (e.g., made of a semiconductor such as doped silicon, indium phosphide (InP), or gallium arsenide (GaAs)) in one arm of the AMZI, which allows for adjustments to the optical-path-length difference between the two interferometer arms that place the desired locking frequency within a range of high locking sensitivity. In other embodiments, an output coupler of the AMZI generates multiple interference signals that differ in the relative phase shifts imparted between the interfering signals and may be combined to obtain a response with a locking sensitivity and accuracy that are significantly less frequency-dependent (or, in some embodiments, nearly frequency-independent) and, thus, less affected by fabrication variations. For example, in certain embodiments, the output coupler provides four output ports and, together with four respective photodetectors at the output ports, forms a 90-degree optical hybrid receiver for measuring balanced in-phase and quadrature signals. More generally, the output coupler of the AMZI and two or more photodetectors may be configured to collectively provide a "coherent receiver," that is, a receiver that generates and measures interference signals that differ by a known value that is not a multiple of 180° in the relative phase shifts imparted between the respective pair of signals being interfered to form the interference signal. Herein, the relative phase shift imparted (prior to interference) between two signals being interfered is the sum of the phase difference incurred in the interferometer arms of the AMZI and an additional relative phase shift imparted by the output coupler. As between two interference signals, these additional relative phase shifts, and thus the (total) relative shifts between the signals being interfered differ in a coherent receiver. In addition to rendering the locking sensitivity less frequency-dependent or even nearly frequency-independent, coherent receivers enable determining the phase difference incurred in the interferometer arms of the AMZI between the two interfering signals (hereinafter also the "filter phase") uniquely within a full period of the AMZI (herein also "filter period").

Apart from fabrication variations, the response of an AMZI can also be affected by fluctuations in the temperature or by mechanical strain. While the effect of temperature can be significantly reduced by choosing materials and dimensions that render the AMZI athermal, a residual temperature dependence remains. In various embodiments, therefore, compensation for changes in the temperature is achieved at least in part computationally, based on temperature measurements with one or more temperature sensors included in the wavelength locker at or near the AMZI. Similarly, mechanical strains, which can be induced post-fabrication due to, e.g., handling, mounting, and installation of the PIC as well as aging, are measured, in accordance with some embodiments, with one or more strain gauges at or near the AMZI to enable computational corrections for strain-induced effects. Temperature and/or strain measurement and compensation in accordance herewith can further improve the wavelength-locking accuracy.

Since the response of an AMZI is periodic in frequency, it allows the frequency position (and, thus, wavelength) of the light source to be determined only within a given filter period of the AMZI, or, in other words, up to multiples of the filter period. This is insufficient if the frequency of the light source can vary by more than a filter period. In some embodiments, this deficiency is overcome by combining two or more AMZIs and associated detectors (e.g., including heaters or 90-degree hybrid receivers) into a two-stage or multi-stage integrated wavelength locker. In a two-stage wavelength locker, the AMZI in one stage acts as a coarse filter to allow the frequency of the incoming light to be located within one of the periods of the AMZI in the other stage, and that second AMZI serves as a finer filter to determine the frequency within the determined filter period.

The foregoing will be more readily understood from the following detailed description of various embodiments, in particular, when taken in conjunction with the accompanying drawings. The description is structured into multiple sub-titled sections that focus on different aspects of the disclosed subject matter. It is to be understood, however, that embodiments may combine aspects or features from the various sections. For example, both wavelength lockers with active tuning elements in an interferometer arm and wavelength lockers with coherent receivers can benefit from the direct measurement and compensation for temperature or mechanical strain, and can be staged to increase the locking range without detriment to the locking accuracy.

System Overview and Operating Principle

FIG. 1 is a schematic diagram of an example wavelength-locking system 100, in accordance with various embodiments, for locking the frequency of a tunable light source 102. The system 100 includes a wavelength locker 104 and associated electronic processing circuitry 106 and memory 108. To lock the frequency of the light source 102, light is coupled from the light source 102 into an AMZI 110 of the wavelength locker 104. At the output of the AMZI 110, an output coupler 112 generates one or more optical interference signals that are measured with detectors 114 (e.g., photodetectors that generate photocurrents proportional to the intensity of the detected light). Various configurations of the output coupler 112 and detectors 114, which together form the receiver 116 of the wavelength locker 104, are described herein below. Electronic signals capturing the measurements are transmitted to the electronic processing circuitry 106, where they can be processed to compute a filter phase of the AMZI 110 (or other filter parameters correlated with the filter phase).

During calibration of the wavelength-locking system 100, light of a desired locking frequency is input to the wavelength locker 104, and the measured photocurrents and/or the filter phase (or other filter parameters) derived therefrom are stored in memory 108 as a target filter phase (or, more generally, target filter parameters). During subsequent wavelength-locking of the light source 102, the stored target filter parameter(s) can be retrieved from memory 108 for comparison with the filter parameter(s) measured at that time, and, based on the comparison, feedback can be provided to the light source 102. Alternatively or additionally to using target filter parameters, calibration may involve tuning an active tuning element in the wavelength locker 104 (such as a power setting of an integrated heater) to achieve specified photocurrents, and storing the setting(s) of the active tuning element (e.g., a heater power setting) in memory 108 as target settings; the wavelength locker 104 is then operated in accordance with these target settings to lock the frequency of the light source 102. Optionally, in accordance with various embodiments, the wavelength locker 104 may include a temperature sensor 118 and/or strain gauge 120 at or near the AMZI 110, allowing the temperature and strain of the AMZI 110 to be measured prior to wavelength-locking the light source 102, and to be compensated for computationally based on comparison with respective temperature and strain values stored in memory 108 at calibration time.

As described in more detail below with respect to FIGS. 9-10B, the wavelength locker 104 may be integrated with the light source 102 on a single PIC. The processing circuitry 106 and memory 108 may be provided on the same chip, or on a separate electronic control chip. If the latter, the PIC and electronic control chip may be packaged into a multi-chip wavelength-locker module. Alternatively, the processing circuitry 106 and memory 108 may be provided, in whole or in part, in an external device.

Figure 2A:
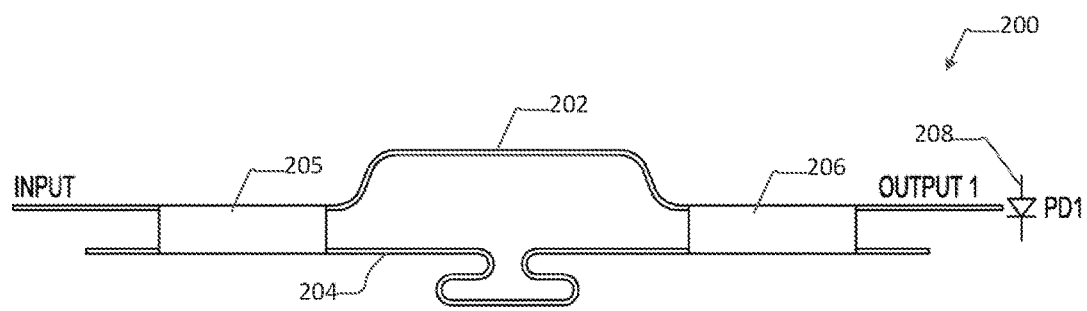
FIG. 2A is a schematic diagram of an example wavelength locker including an asymmetric Mach-Zehnder interferometer (AMZI) and a single detector, in accordance with various embodiments.

FIG. 2A is a more detailed schematic diagram of an example AMZI 200, illustrating the principle of wavelength locking in accordance with various embodiments. The AMZI 200 includes two interferometer arms 202, 204 with different optical path lengths, imparting generally different respective phase shifts on light propagating through the two arms 202, 204. The light is coupled into, and split between, the two interferometer arms 202, 204 by an input coupler 205. At the output of the AMZI 200, recombination and interference of the light by an output coupler 206 produces an optical response, measurable with a suitable optical detector 208, that depends on the relative phase shift between the interferometer arms 202, 204 (that is, the filter phase), and thus varies periodically in frequency. The periodicity in frequency, which is also called the "free spectral range (FSR)" of the interferometer, is inversely proportional to the optical-path-length difference between the two arms 202, 204.

Figure 2B:
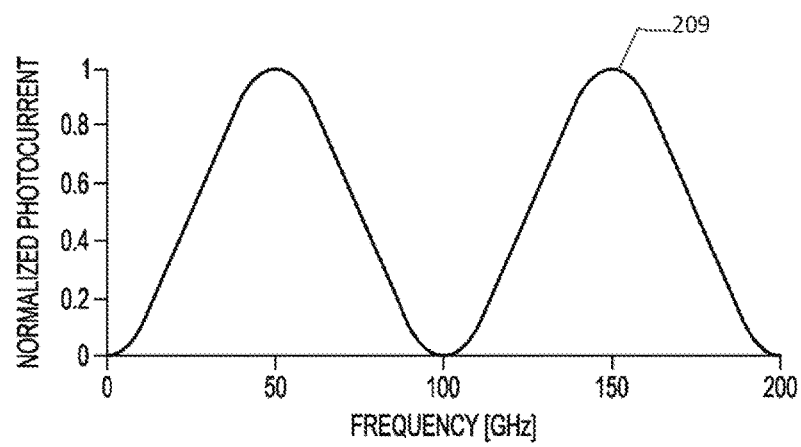
FIG. 2B is a graph of the photocurrent measured, for a wavelength locker as shown in FIG. 2A, as a function of frequency, in accordance with various embodiments.

FIG. 2B illustrates the frequency-dependent optical response 209, as measured by a single photodetector (such as detector 208) as an induced photocurrent, of an AMZI having an FSR of 100 GHz. (The depicted frequency is taken relative to some absolute frequency value.) The photocurrent/is proportional to the detected power $P_{det}$ (the responsivity R of the detector being the proportionality factor), which is a function of the input power $P_{in}$ and the relative phase shift, or filter phase, $\varphi_{filter}$ between the two interferometer arms:

$$I = RP_{det} = \frac{1}{2}P_{in}R(1 + \cos\varphi_{filter})$$

The optical response of the AMZI can be calibrated against a known external wavelength reference, such as a precise calibration laser or filter, and thereafter used as an integrated optical reference. Calibration may involve tuning the on-chip laser until it matches the external wavelength reference, and recording the resulting photocurrent in memory. After deployment in the field, deviations of the measured photocurrent from the recorded value can be used as feedback to stabilize the laser wavelength.

As can be seen in FIG. 2B, the locking sensitivity, that is, the sensitivity of the measured transmitted power (or photocurrent or other AMZI response 209) to changes in frequency of the light source, which corresponds to the slope $dP_{det}/df$ of the frequency-dependent power, varies itself with frequency, and is maximum at the filter mid-point, where the power (or photocurrent) is at half its peak value. Accordingly, the filter mid-point is the optimal locking position. Conversely, when the desired locking frequency is at the peak or null, the slope is zero, and thus the locking sensitivity is poor, causing degraded wavelength-locking accuracy. In addition, around the peak or null, the frequency determination can be ambiguous in certain system configurations, as frequency changes of a given magnitude in either direction from the peak or null result in the same photocurrent and are, thus, indistinguishable absent frequency dithering of the light source (which would allow determining the slope of the photocurrent as a function of frequency). (Viewed differently, the frequency can be determined uniquely only if it is known to fall between a particular pair of adjacent peak and null, corresponding to a range that is only half the FSR.) To avoid this ambiguity (or increase the locking range of the filter to its full FSR) and achieve high locking sensitivity, it is desirable to configure the wavelength locker such that the desired locking frequency (corresponding to the calibration frequency) falls at or near the filter mid-point. In practice, however, fabrication variations cause the AMZI response to be frequency-shifted from device to device, such that the calibration frequency may be near the mid-point, peak, or null of the filter response; the locking sensitivity thus varies between devices, and is unpredictable for any given device. While, in principle, the AMZI can be measured and corrected post-fabrication (e.g. by focused laser annealing on the chip surface to trim each device to be within specifications), this approach is not well-suited for high-volume production.

Figure 2C:
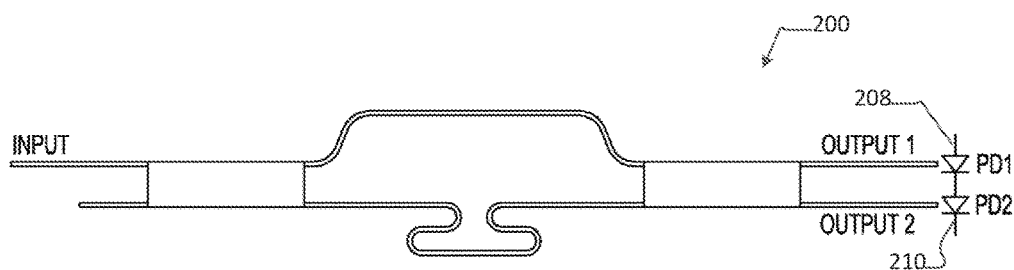
FIG. 2C is a schematic diagram of an example wavelength locker including an AMZI with a balanced receiver, in accordance with various embodiments.
Figure 2D:
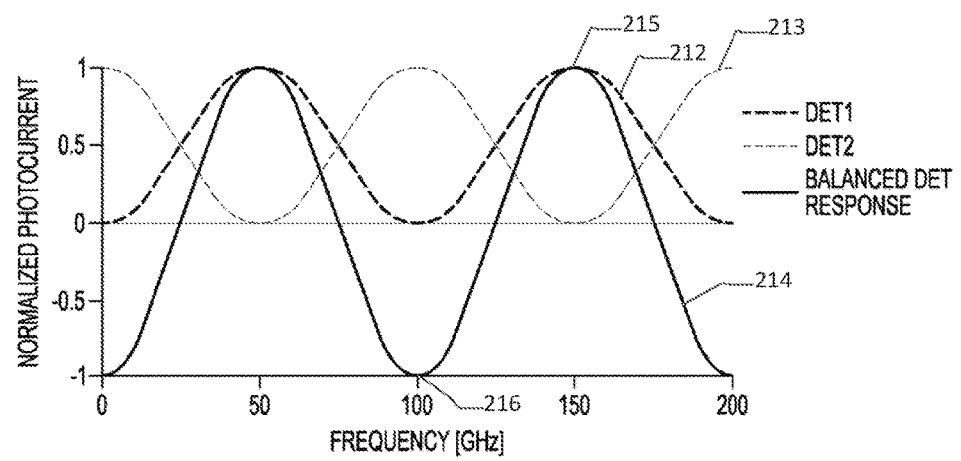
FIG. 2D is a graph of the individual and balanced photocurrents measured for the wavelength locker of FIG. 2C as a function of frequency, in accordance with various embodiments.

FIG. 2C is a schematic diagram of a wavelength locker including an AMZI 200 and two detectors 208, 210 placed on the two opposite output ports of the AMZI 200 to create a "balanced receiver." FIG. 2D is a graph of the frequency-dependent photocurrents 212, 213 measured at the two individual detectors 208, 210 as well as the balanced detector response 214 resulting from the subtraction of one detector signal from the other one. As can be seen, the balanced receiver captures all the transmitted power, increasing the overall signal amplitude and, thus, the locking sensitivity by a factor of two. However, the locking sensitivity $dP_{det}/df$ still varies depending on the locking position, and is poor at the filter peak 215 or null 216. Assume, for example, that the locking position is at 50 GHz in FIG. 2B and that only changes >10% of the full-scale voltage range can be measured for the signal to exceed a 10% noise level. The frequency range corresponding to signal fluctuations below the noise floor will be ±3.6 GHz around the locking position (as shown analytically further below), allowing oscillation up to this magnitude to occur. By contrast, when the locking position is at 25 GHz in FIG. 2D, the minimum measurable frequency shift will be ±0.8 GHz, corresponding to a much higher locking accuracy. In addition to still being subject to a high variability in the locking sensitivity, the balanced receiver does not resolve the ambiguity in determining the filter phase and, thus, the frequency of the light source across a full FSR.

Active Wavelength Locker Tuning

Figure 2E:
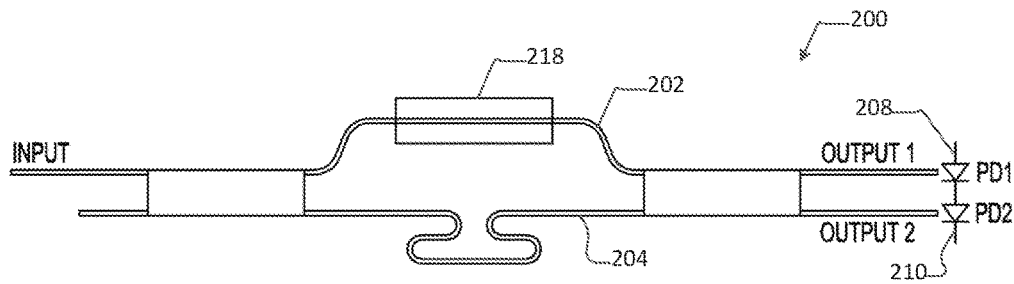
FIG. 2E is a schematic diagram of an example wavelength locker including an AMZI with an active tuning element and a balanced receiver, in accordance with various embodiments.

To overcome the variability of the locking sensitivity due to fabrication variations and facilitate unambiguous filter-phase determinations over about half a filter period, the AMZI may be provided, in accordance with some embodiments, with an active tuning element in one of the interferometer arms to adjust the optical-path-length difference and thereby move the locking frequency to a high-sensitivity filter position post-fabrication. In FIG. 2E, the active tuning element is symbolically shown as element 218. The active tuning element 218 may, for example, be a heater that can be used to change the refractive index and/or the physical length (the former generally dominating) of a portion of one of the waveguides (as shown, the waveguide forming interferometer arm 202). Alternatively, the active tuning element 218 may utilize semiconductor materials to adjust the refractive index within a portion of the waveguide forming interferometer arm 202, e.g., exploiting the linear or quadratic electro-optic effect in compound semiconductors such as InP and GaAs, or free carrier absorption in doped silicon or compound semiconductors. Calibrating the AMZI 200 involves using the active tuning element 218 to align the maximum-slope position of the AMZI filter to the calibration frequency, and then holding the setting(s) of the active tuning element, such as, in the case of a heater, the heater power, constant. The calibrated setting(s) (e.g., heater power value) are saved as the target setting(s), and can be recalled when needed to maintain alignment of the AMZI 200. The stability of a wavelength locker with an integrated heater is strongly determined by the stability of the heater and its power supply (and/or any ambient temperature sensor).

Coherent Receiver Configurations

In some embodiments, the severity of sensitivity variations with fabrication is significantly reduced, and an unambiguous determination of the filter phase across the full filter period is facilitated, through use of a coherent receiver. In a coherent receiver, the output coupler 206 of the AMZI 200, which receives the two signals coming through the two interferometer arms 202, 204 as inputs and generates multiple respective optical interference signals as outputs, imparts additional relative phase shifts $\Delta\varphi_i$ (where i is an index running through the number of interference signals) between the two interfering signals (for total relative phase shifts of $\varphi_{filter}+\Delta\varphi_i$), and these additional relative phase shifts $\Delta\varphi_i$ differ between at least two of the optical interference signals by a value that is not a multiple of 180°. In a 90-degree hybrid receiver, for example, four optical interference signals with additional relative phase shifts $\Delta\varphi_i$ (i=1, 2, 3, 4) between the interfering signals of 0°, 90°, 180°, and −90° are created. In a 120-degree hybrid receiver, three optical interference signals with additional relative phase shifts $\Delta\varphi_i$ (i=1, 2, 3) of 0°, 120°, and −120° are created. In general, from three optical interference signals with three different relative phase shifts (at least two of which differ by a value that is not a multiple of 180°), or from two optical interference signals with different relative phase shifts (differing by a value that is not a multiple of 180°) in conjunction with known amplitudes of the interfering signals, the filter phase and, thus, the frequency of the light source can be uniquely determined within a filter period (that is, up to multiples of 360° or the FSR, respectively).

FIG. 3A illustrates, as an example of a coherent receiver in accordance herewith, a 90-degree optical hybrid receiver with four detectors at the output of an AMZI 300. The 90-degree hybrid receiver can be implemented using, as the output coupler 306 of the AMZI 300, e.g., a 4×4 multimode interference (MMI) coupler, a 2×4 MMI coupler followed by a 2×2 MMI coupler, a star coupler, or three directional couplers (see, e.g., Seok-Hwan Jeong et al., "Compact optical 90 hybrid employing a tapered 2×4 MMI coupler serially connected by a 2×2 MMI coupler," Opt. Express 18[5], 4275-4288 (2010), which is hereby incorporated herein by reference). However implemented, the output coupler 306 provides four output ports, whose respective signals are measured by the four detectors 308, 309, 310, 311. FIG. 3B shows the signals 312, 313, 314, 315 measured by the detectors 308, 309, 310, 311, respectively. The four detectors 308, 309, 310, 311 form two balanced pairs of detectors. One balanced pair of detectors 308, 309 measures in-phase signals 312, 313 resulting from additional relative phase shifts $\Delta\varphi_i$ of 0° and 180° (up to multiples of 360°), providing a balanced in-phase photocurrent signal (I):

$$I_I = \frac{1}{2}R \cdot P_{in} \cdot \cos\varphi_{filter}.$$

The other balanced pair of detectors 310, 311 measures quadrature signals 314, 315 resulting from additional relative phase shifts $\Delta\varphi_i$ of ±90° (up to multiples of 360°), providing a balanced quadrature photocurrent signal (Q):

$$I_Q = \frac{1}{2}R \cdot P_{in} \cdot \sin\varphi_{filter}.$$

Figure 3C:
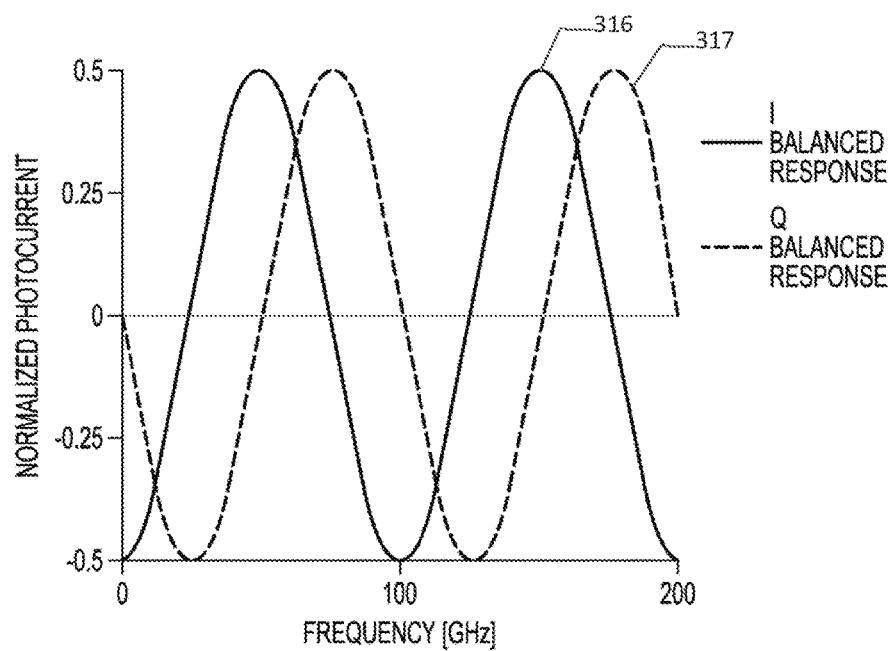
FIG. 3C is a graph of the balanced in-phase and quadrature photocurrents measured for the wavelength locker of FIG. 3A as a function of frequency, in accordance with various embodiments.

FIG. 3C illustrates the balanced I and Q responses 316, 317 for the respective detector pairs.

Figure 3D:
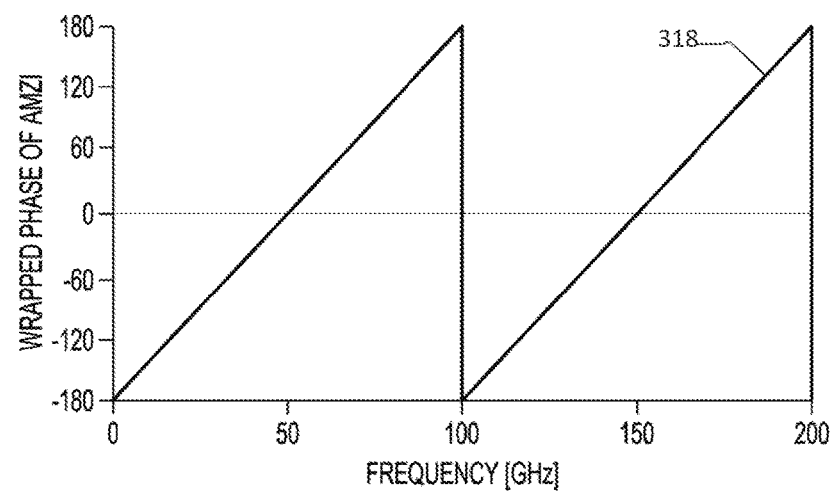
FIG. 3D is a graph of the AMZI filter phase computed from the measured in-phase and quadrature photocurrents of FIG. 3C as a function of frequency, in accordance with various embodiments.

From the I and Q responses 316, 317, the filter phase $\varphi_{filter}$ can be straightforwardly extracted, e.g., using the two-argument arctangent function (which resolves the ambiguity of the arctangent function by considering the signs of the sine and cosine separately). FIG. 3D shows the (phase-wrapped) filter phase $\varphi_{filter}$ 318 calculated based on the I and Q responses. As can be seen, the phase 318 of the filter is linear from −180 to 180 degrees over the entire filter period (or FSR) of the filter. Compared with the response 209 of a single detector as shown in FIG. 2B or the balanced detector response 214 shown in FIG. 2D, where a phase determination near the peak or null of the response is ambiguous as phases to either side of the phase or null result in the same photocurrent, the filter phase 318 in FIG. 3D can be determined uniquely within the filter period (or FSR).

The I and Q responses 316, 317, which correspond to the real and imaginary components of the interference from the two AMZI paths, can be combined into a complex-valued signal with constant amplitude and a frequency-dependent phase (corresponding to the filter phase). The sensitivity of this complex-valued signal to changes in frequency is generally lower than the sensitivity of a single balanced receiver at its best operating point, but exhibits lower frequency-dependency than the signal of a single balanced receiver, and may, in some embodiments, even become frequency-independent, depending on what the factors limiting the sensitivity are (e.g., types of noise, which may or may not be independent between the I and Q responses, or resolution of the analog-to-digital conversion of the photocurrents). In general, sensitivities for the 90-degree hybrid differ between the best and worst locking positions at most by a factor of only about 1.4, compared with a factor of about 44 for the balanced receiver at a 0.1% relative noise level, and a factor of about 140 at a 0.01% noise level—therefore there is a greater benefit to using the 90-degree hybrid as the noise levels are reduced. At a 0.01% relative noise level, the 90-degree hybrid frequency accuracy is more than 50 times (corresponding to more than 5 bits) better than the balanced detector at their respective worst operating points, while the accuracy of the balanced receiver is only about twice as good as that of the 90-degree hybrid receiver at their respective best operating points. Thus, while the highest locking sensitivity achieved with the 90-degree hybrid receiver is lower than that achieved with a balanced receiver, the worst performance is better with the 90-degree hybrid receiver. The wavelength locker with 90-degree hybrid receiver works similarly well at all locking positions.

The sensitivity, or accuracy, of a wavelength locker is determined by the slope of the frequency-dependent transfer function $I(P_{in})$ (which depends on the receiver used) at a given filter position and the level of noise in the detected signal. More specifically, the accuracy can be determined as the minimum frequency shift $\Delta f$ that results in a change $\Delta I$ in the measured photocurrent just above the noise $I_{noise}$, which is modeled as the maximum noise level and is independent of signal amplitude:

$$|\Delta I| = \left|\frac{dI}{df}\Delta f\right| \cong I_{noise}.$$

From $$\varphi_{filter} = \frac{2\pi}{FSR}f = A_1 f,$$

where $2\pi/FSR \equiv A_1$ and FSR denotes the filter period of the AMZI, follows:

$$|\Delta I| = \left|\frac{dI}{d\varphi_{filter}}A_1 \Delta f\right| \cong I_{noise},$$

or, inverted for $\Delta f$:

$$|\Delta f| \cong \frac{I_{noise}}{\left|\frac{dI}{d\varphi_{filter}}\right|A_1}.$$

Evaluating this expression for the balanced receiver, whose transfer function is $$I(P_{in}) = R \cdot P_{in} \cdot \cos \varphi_{filter} = R \cdot P_{in} \cdot \cos(A_1 f),$$

we obtain, for values of f for which $\sin(A_1 f) \neq 0$:

$$|\Delta f| = \frac{I_{noise}}{R \cdot P_{in} \cdot A_1 \cdot |\sin(A_1 f)|}.$$

For $\sin(A_1 f)=0$, the accuracy $|\Delta f|$ can be approximated as the change $|f-f_0|$ from $A_1 f_0=0$ for which the corresponding change in photocurrent, $|I-I_0|$ exceeds the noise:

$$|\Delta I| = |I - I_0| = R \cdot P_{in}(1 - \cos(A_1 f)) \cong I_{noise}$$

$$|\Delta f| = |f - f_0| = f \cong \frac{1}{A_1}\arccos\left(1 - \frac{I_{noise}}{R \cdot P_{in}}\right)$$

For the 90-degree optical hybrid receiver, the same analysis can be applied to the in-phase and quadrature balanced outputs, each with half the peak photocurrent and the same noise as in the balanced photodetector case (corresponding to an overall signal-to-noise degradation by the square root of two). This is a worst-case estimate on accuracy of the 90-degree hybrid, and assumes that the (e.g., thermal or cross-talk) noise is fixed per electrical trace. The transfer functions for the two balanced outputs are:

$$I_I(P_{in}) = \frac{1}{2}R \cdot P_{in} \cdot \cos\varphi_{filter} = \frac{1}{2}R \cdot P_{in} \cdot \cos(A_1 f)$$

$$I_Q(P_{in}) = \frac{1}{2}R \cdot P_{in} \cdot \sin\varphi_{filter} = \frac{1}{2}R \cdot P_{in} \cdot \sin(A_1 f)$$

For $A_1 f=0$, the accuracy is limited by the quadrature output accuracy, $$|\Delta f_Q| = \frac{I_{noise}}{R \cdot \frac{P_{in}}{2} \cdot A_1 \cdot |\cos(A_1 f)|},$$

and for $A_1 f=\pi/2$, the accuracy is limited by the in-phase output accuracy, $$|\Delta f_I| = \frac{I_{noise}}{R \cdot \frac{P_{in}}{2} \cdot A_1 \cdot |\sin(A_1 f)|}$$

Assuming that the two balanced receiver lines each can have the same maximum noise magnitude, the total maximum noise can be calculated by combining in quadrature:

$$|\Delta f| = \frac{\sqrt{2} \cdot I_{noise}}{R \cdot \frac{P_{in}}{2} \cdot A_1 \cdot (|\cos(A_1 f)| + |\sin(A_1 f)|)}$$

$$= \frac{I_{noise}}{R \cdot P_{in}} \cdot \frac{\sqrt{2} \cdot FSR/\pi}{(|\cos(A_1 f)| + |\sin(A_1 f)|)}$$

This analysis is also useful for calculating the frequency uncertainty due to quantization error in analog-to-digital conversion of the signal. For quantization error, the two balanced receiver lines will each have the same current resolution and maximum error due to quantization. The total frequency uncertainty due to quantization error will be at a minimum for relative phases of the two AMZI waveguide modes of 0, 90, 180, or 270 degrees, where all of the error is due to one of the two balanced detector channels. The total quantization error will be larger by a factor of $\sqrt{2}$ for relative phases of the two AMZI waveguide modes of 45, 135, 225, or 315 degrees, where both of the balanced detector channels contribute equally to the error.

There are other situations in which the frequency uncertainty of a coherent receiver may be nearly independent of the phase of the two AMZI waveguide modes. This can occur if the noise sources on the two balanced channels each have identical Gaussian distributions, where the noise sources are uncorrelated. This model is appropriate if the noise is due solely to Johnson-Nyquist noise of the detection and amplification circuits. The key difference in this model that results in phase independence is that the modeling of noise with a probability distribution instead of a maximum noise per channel avoids a penalty at $45+90 \cdot n$ degrees, where both balanced detector channels contribute equally to the signal, because their probability distributions are combined orthogonally. Therefore, at a given point in time, the probability that both balanced detector channels introduce an above-average level of noise error is lower than the probability that the first of the two balanced detector channels introduces an above-average level of noise error.

From the above expressions for the balanced receiver and the 90-degree hybrid receiver, the receiver accuracies can be computed for a given operating point and relative noise level $I_{noise}/(R \cdot P_{in})$. To reduce the noise level, the AMZI or light source may have a frequency dither applied to reduce direct-current (DC) noise, and the signal may then be measured at an integer multiple of the dither frequency. However, regardless of the overall noise level in the system, the relative accuracies between different receiver configurations remain the same. The following table compares the best-case and worst-case receiver accuracies of the balanced receiver and 90-degree hybrid receiver with fixed noise at three relative noise levels. (For the balanced receiver, the worst operating point is at the position where the filter response has the lowest slope, that is, at the peak or null, and the best operating point is at the position where the filter response has the highest slope, that is, the filter mid-point. For the 90-degree hybrid, the worst operating point is at points where the in-phase and quadrature signal are equal in amplitude.) The case of a 90-degree hybrid receiver with uncorrelated Gaussian noise in the balanced detector channels is also included. For the latter case, the noise level can be independent of phase. Since it is a probabilistic distribution, the noise can be described probabilistically. For example, in the table, the 3σ noise level refers to a level of noise that will not be exceeded for 99.7% of measurements.

ing performance. For a 120-degree hybrid receiver, the accuracy is similar to that of the 90-degree hybrid receiver. To compute the accuracy of the 120-degree hybrid receiver, the received power is computationally separated into orthogonal components, and then the above formulism for the 90-degree hybrid is followed. For other non-standard multiphase receivers with the incoming power nonuniformly distributed between the in-phase and quadrature orthogonal states, the amount of power received in each state can be used to calculate the best and worst operating points.

Beneficially, a wavelength locker with a coherent receiver allows the stability of a passive optical cavity to be achieved, and since a passive optical cavity dissipates no power, its stability can be significantly better than that of active tuning elements. Additional benefits of the coherent receiver include reduced power consumption since no tuning element is required; reduced thermal gradients that could impact stability or reliability on the PIC since heaters for phase tuning are avoided; and simplified feedback loop and controls as the laser (or other light source) directly locks to the AMZI, without additional tuning and stabilization circuits.

Staged Filter Configuration

The wavelength accuracy of wavelength lockers in accordance herewith is, as shown above, proportional to the filter period (or FSR) of the AMZI. A narrower period (e.g., 100 GHz, as shown in FIGS. 2B, 2D, and 3B-3D) provides greater wavelength accuracy than a wider period (e.g., 2 THz). It is common that the wavelength of the light source can tune beyond the limits of a single narrow AMZI period, introducing an ambiguity in the frequency. A single AMZI allows the frequency of the light source to be determined only up to multiples of its FSR. In order to resolve this

| Relative noise level $I_{noise}/(R \cdot P_{in})$ | Balanced receiver | | 90-degree hybrid receiver with fixed noise in each balanced detector channel | | 90-degree hybrid receiver with uncorrelated Gaussian noise in the balanced detector channels | |
|---|---|---|---|---|---|---|
| | Worst operating point | Best operating point | Worst operating point | Best operating point | Worst operating point, 3σ noise level | Best operating point, 3σ noise level |
| 01% [40 dB SNR] | 0.23% of FSR | 0.0016% of FSR | 0.0045% of FSR | 0.0032% of FSR | 0.0032% of FSR | 0.0032% of FSR |
| 0.1% [30 dB SNR] | 0.72% of FSR | 0.016% of FSR | 0.045% of FSR | 0.032% of FSR | 0.032% of FSR | 0.032% of FSR |
| 1% [20 dB SNR] | 2.3% of FSR | 0.16% of FSR | 0.45% of FSR | 0.32% of FSR | 0.32% of FSR | 0.32% of FSR |
| 10% [10 dB SNR] | 7.2% of FSR | 1.6% of FSR | 4.5% of FSR | 3.2% of FSR | 3.2% of FSR | 3.2% of FSR |

Figure 4A:
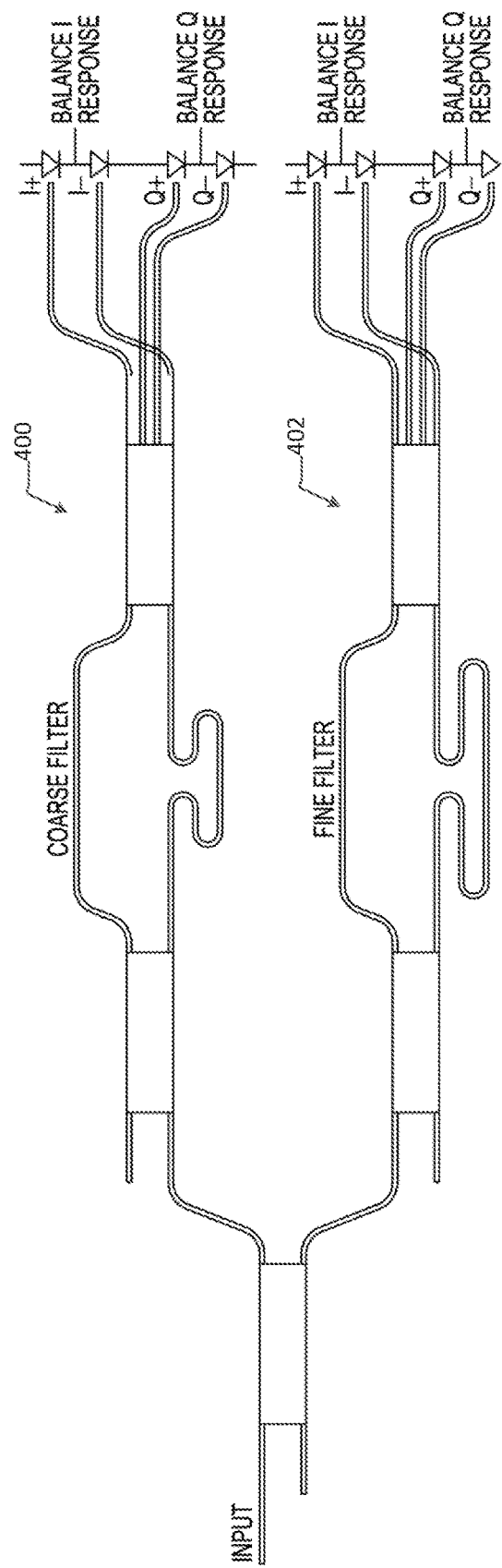
FIG. 4A is a schematic diagram of a wavelength locker including coarse and fine filters each including an AMZI with a 90-degree hybrid receiver, in accordance with various embodiments.
Figure 4B:
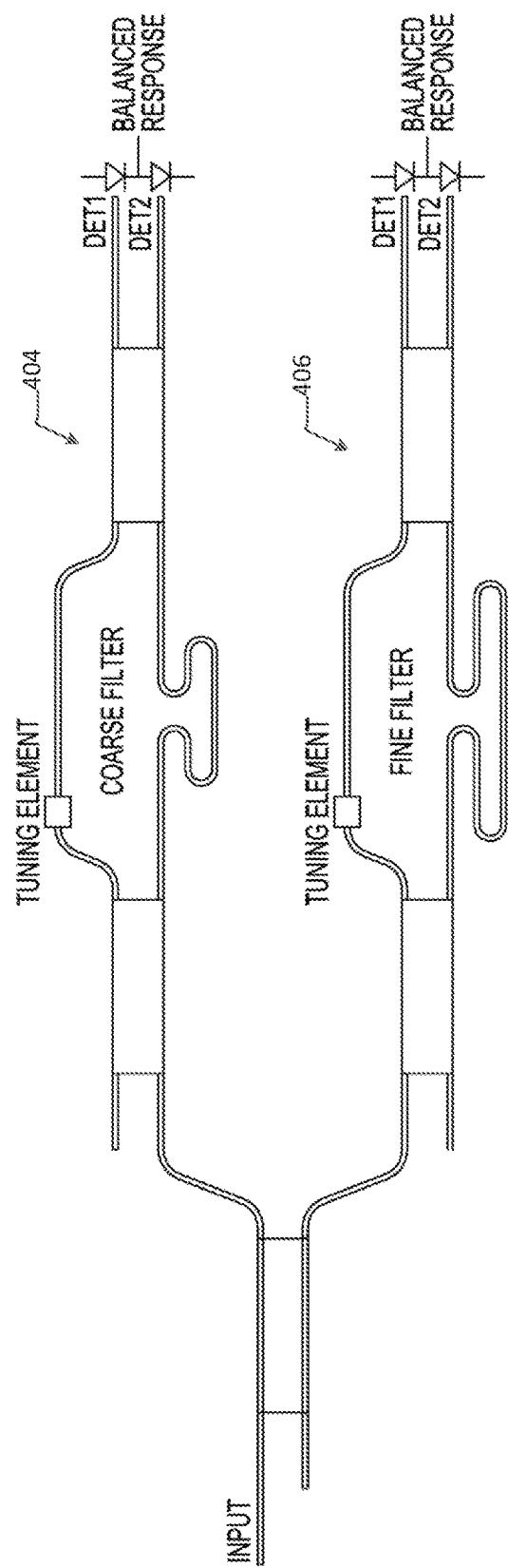
FIG. 4B is a schematic diagram of a wavelength locker including coarse and fine filters each including an AMZI with an active tuning element in one interferometer arm, in accordance with various embodiments.

As a comparison of the results for the balanced receiver and the 90-degree hybrid receiver reveals, the accuracy of the 90-degree optical hybrid receiver is lower than that of the balanced receiver at the optimal operating point, but higher than that of the balanced receiver at the worst operating point. When the position of the filter is unknown, e.g., due to fabrication variations and lack of post-fabrication tuning, the system is generally designed for the worst-case operating condition; accordingly, the 90-degree hybrid configuration is generally preferable. In addition to providing a better performance in the worst-case scenario, the 90-degree hybrid receiver configuration results in lower variability of the accuracy, improving the predictability of wavelength lock-ambiguity while still achieving the higher wavelength accuracy afforded by a narrow-period filter, a secondary, coarser filter may be used, in accordance with some embodiments, to locate a single period of the fine filter. Such a two-stage filter is shown in FIGS. 4A and 4B. With reference to FIG. 4A, the input signal is split between two AMZIs 400, 402, each of which is equipped with a 90-degree hybrid receiver in accordance with the embodiment of FIGS. 3A-3D. One AMZI 400 has a large FSR (e.g., 2 THz) and acts as a coarse filter to determine the frequency of the light source with sufficient accuracy to locate it within a specific one of the filter periods of the other AMZI 402. That other AMZI 402 has a small FSR (e.g., 100 GHz) and acts as a fine filter to determine the frequency of the light source within the determined filter period. As will be appreciated, this two-stage wavelength locker configuration is generally applicable to any AMZIs, and does not require the use of 90-degree hybrid receivers (although they are beneficial). For example, as shown in FIG. 4B, AMZIs 404, 406 with active tuning elements may be used to achieve optimal locking positions within each AMZI 404, 406.

It will further be appreciated that three or more AMZIs with different respective FSRs may be used to accommodate even larger tuning ranges of the light source and/or allow for increased wavelength accuracy through the use of a narrower-period AMZI in the finest filter stage. In operation, the wavelength of the light source is known to be within the overall operating range of the coarse filter, or is placed within that range using additional sensors such as a temperature reading or photocurrent from another component. Information from the coarse filter transmission is then used to align the laser within a single period of the next-finer filter, and so forth until a single period of the finest filter can be located. The factor by which the addition of a filter stage can increase the overall frequency range covered by the multi-stage wavelength locker is the ratio between the range covered by the added filter stage to its frequency accuracy. In various embodiments, a single filter stage can cover a frequency range that is at least five times, and may even reach one hundred times, its frequency accuracy, with an accuracy of less than 1 GHz being achievable when strain and temperature sensors are used. Thus, a single filter stage may, for example, achieve locking accuracies of 50 GHz or less simultaneously with locking ranges in excess of 250 GHz or even 5 THz in some embodiments. Using multi-stage wavelength-locker configurations, locking accuracies of 50 GHz may be achieved simultaneously with locking ranges in excess of 8 THz, which corresponds to a 60 nm laser tuning range in the C band and will be sufficient for a large number of applications. With each filter stage added, the range requirements for each individual stage can be relaxed.

Temperature and Strain Compensation

The optical response of an AMZI generally shifts in frequency in response to temperature changes that cause thermal expansion or changes in the thermo-optic coefficient, or as a result of strain-induced changes in the path-length difference between the interferometer arms. Consequently, in the presence of temperature changes or mechanical strain, the wavelength accuracy of the AMZI, used as a wavelength reference in accordance herewith, is diminished unless the temperature and/or strain are accounted for.

Temperature-related shifts in the AMZI response can be significantly reduced with an athermal AMZI, as is known in the art and may be employed in embodiments of the disclosed subject matter. To render an AMZI athermal, waveguide portions with complementary thermal properties can be exploited to configure the waveguide arms such that the temperature-induced optical-path-length change in each arm, or at least the difference between any temperature-induced optical-path length changes in the two arms, is minimal over the operating temperature range. The complementary thermal properties may be achieved through the use of different waveguide materials and/or different waveguide widths. For instance, in some embodiments, a single material such as silicon (Si), silicon oxide (SiO$_2$), GaAs, or InP is used in conjunction with two waveguide widths; in other embodiments, two different materials, such as silicon and silicon nitride (SiNx), or silicon and silicon oxide, are used for the two waveguides; and in still further embodiments, a single waveguide material and width are combined with two different cladding materials (e.g., spin-on polymers) for the two waveguides.

In one particular embodiment, a first material (e.g., silicon) having a dispersion $d\beta_1/dT$ is used for an extra length $\Delta l$ in one waveguide, and a second material (e.g., SiNx) with different dispersion $d\beta_2/dT$ is used for an extra length $\Delta l+\Delta L$ of the other waveguide; herein, $\beta_i=2\pi\bar{n}_i/\lambda$ (i=1,2) is the wavenumber, with $\bar{n}_i$, being the refractive index of the respective material, and the dispersion is the change in the wavenumber with a change in temperature T. The lengths $\Delta l$ and $\Delta L$ are chosen, dependent on the two materials, such that, as the AMZI experiences a temperature change relative to a given wavelength-specific temperature, herein the "nominal athermal temperature," the resulting change in the optical path lengths is substantially the same for both interferometer arms, such that the difference in optical path lengths between the arms stays substantially fixed (i.e., varies by a small amount for small temperature changes around the nominal athermal temperature). Consequently, the filter phase $\varphi=[\beta_1 \Delta L+\Delta l(\beta_1-\beta_2)]$ remains unaffected by the change in temperature.

Figure 5A:
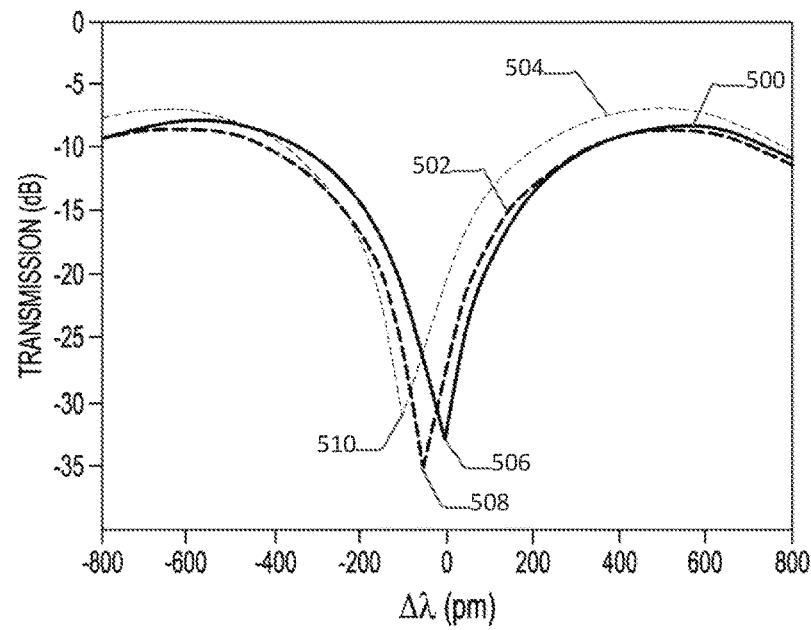
FIG. 5A is a graph of the filter transmission as a function of relative wavelength at temperatures of 30° C., 53° C., and 85° C., respectively, for a silicon/silicon-nitride-(Si/SiNx)-based athermal AMZI in accordance with various embodiments.
Figure 5B:
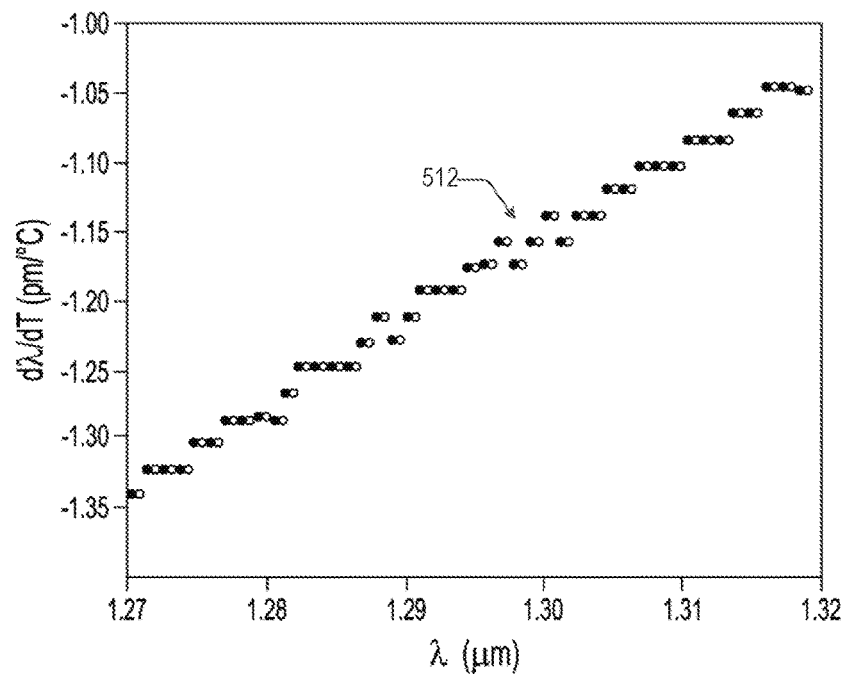
FIG. 5B is a graph of the wavelength-dependent residual athermality of an Si/SiNx-based athermal AMZI in accordance with various embodiments.

Results for a fabricated athermal AMZI using Si and SiNx waveguides are shown in FIGS. 5A and 5B. In FIG. 5A, the transmission null of the athermal AMZI (corresponding to destructive interference at the output) is illustrated for 30° C. (solid line 500), 53° C. (bold dashed line 502), and 85° C. (fine dashed line 504), respectively. As can be seen, temperature variations of this magnitude cause shifts in the peak wavelength $\lambda_{peak}$ (corresponding to peaks 506, 508, 510, respectively) on the order of 0.1 nm. FIG. 5B shows the wavelength dependence of the remaining athermality $d\lambda_{peak}/dT$ 512 at 53° C. over a wavelength range from 1270 to 1320 nm; the athermality is on the order of −1 pm/° C. across that range.

Figure 6:
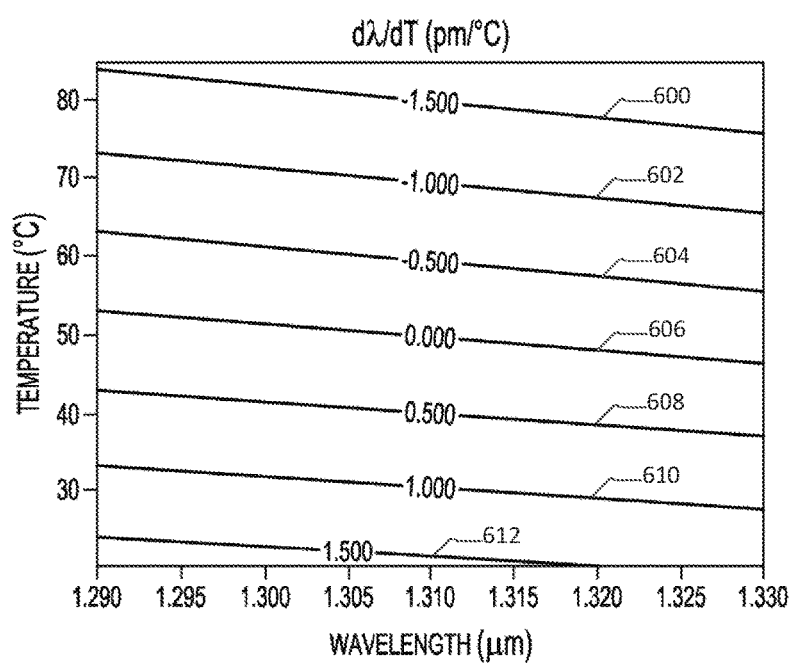
FIG. 6 is a graph of the athermality of the residual athermality of an Si/SiNx-based athermal AMZI in accordance with various embodiments for a range of temperatures and wavelengths.

An athermal AMZI is completely athermal (in the sense that the variation of the filter peak-transmission wavelength or frequency with temperature, $d\lambda_{peak}/dT$ or $df_{peak}/dT$, equals zero) only at the nominal athermal temperature for a given peak wavelength. Away from the nominal athermal temperature, a slight error grows. This is illustrated in FIG. 6, which shows lines of constant levels of athermality (lines 600, 602, 604, 606, 608, 610, 612) within a two-dimensional space spanning a range of wavelengths and temperatures. The error may be insignificant for coarse applications, but it can have a practically significant effect when the required frequency accuracy of the wavelength locker is ≤50 GHz.

In accordance with various embodiments, therefore, the error is compensated for by measuring the temperature of the AMZI with an integrated temperature sensor placed in the vicinity of the AMZI (e.g., sensor 118 in FIG. 1), and computationally correcting the stored target filter phase (or other target filter parameters) for the AMZI, which corresponds to the desired locking frequency, based on the measured temperature. For this purpose, the AMZI filter response is measured (prior to device deployment) at multiple wavelengths and temperatures. The computational correction may be implemented with processing logic (e.g., provided as part of electronic processing circuitry 106) configured to calculate correction coefficients or adjustments to stored target parameters/settings once the temperature and, in some instances, photocurrents have been measured, e.g., using a stored functional dependence of the correction coefficient and/or target parameters/settings on the temperature. Alternatively, a pre-computed look-up table of correction coefficients and/or corrected target parameter values or settings may be stored (e.g., in memory 108), and the electronic processing circuitry may be configured to select one of the stored correction coefficients and/or target parameter values or settings based on the measured temperature and strain. Combinations of real-time computation and precomputation may also be used. The processing logic and/or look-up table may be provided on-chip (or at least in the same multi-chip module) or in an external device accessible by the wavelength locker.

Comparison of the filter phase computed from the detector signals with the adjusted target filter phase (or, alternatively, comparison of the measured filter phase, adjusted based on the temperature, with the (original) target filter phase) can be used as feedback to tune the laser (or other light source) to the desired locking frequency. For an error of $\Delta T_{sensor}$ of the integrated temperature sensor, the error of the temperature-induced shift in peak wavelength is $d\lambda_{peak}/dT \cdot \Delta T_{sensor}$. Since $d\lambda_{peak}/dT$ is small, the temperature reading does not need to be highly accurate to provide a significant correction to the athermal AMZI. For example, a 5° C. error on a 50° C. temperature change still corrects ~90% of the temperature-induced error on the athermal AMZI. Additionally, a 5° C. error on a 0° C. temperature change causes less than a 1 GHz error due to the high athermality of the AMZI. A temperature sensor, thus, provides an enhancement to the athermal AMZI, and the relative error of the wavelength locker is better than that of the temperature sensor.

Similarly to temperature effects, strain-induced variations of the AMZI response can be accounted for, in accordance with various embodiments, by computational corrections based on strain measurements. Strain effects can change the path length of an AMZI, thereby shifting its frequency-dependent response. During calibration, the integrated wavelength locker is mapped to an external wavelength reference, and any strain changes that occurred prior to calibration are inherently accounted for. However, strain changes after calibration due to handling, mounting, installation, and aging of the wavelength locker will impact the filter position. To measure strain, an integrated strain gauge may be made using two resistance temperature detectors (RTDs) with different metals. One metal has a high temperature coefficient of resistance (TCR), whereas the other has a low TCR; for example, the higher TCR may be greater than 1000 ppm/C° and the lower TCR may be smaller than 100 ppm/C°. It is, furthermore, beneficial to have a low gauge factor (GF, defined as the ratio of the relative change in electrical resistance to applied strain) on the high-TCR metal, and a low coefficient of thermal expansion (CTE) on the low-TCR metal to minimize strain measurement errors. In some embodiments, the GF of the high-TCR metal is smaller than 6, and the CTE of the low-TCR metal is smaller than 100 ppm/° C. Suitable metals for the two RTDs are, for instance, platinum (Pt) for the high-TCR metal and nickel chromium (NiCr) for the low-TCR metal. While NiCr is the most common integrated low-TCR metal, additional suitable metals and alloys include nickel chromium silicon (NiCrSi), tantalum nitride (TaN), and chromium silicon tantalum aluminum (CrSiTaAl). Common integrated high-TCR metals include aluminum (Al), nickel (Ni), and tungsten (W), while gold (Au), silver (Ag), and copper (Cu) are less commonly used. The resistance changes undergone by RTDs made from these two metals with changes in temperature and strain ($\Delta T$ and $\Delta \epsilon$, respectively) are:

$$R_{Pt\ RTD} = R_{0,Pt\ RTD}(1 + TCR_{Pt} \cdot \Delta T + GF_{Pt} \cdot \Delta \epsilon + \Delta CTE_{Pt} \cdot \Delta T \cdot GF_{Pt})$$

$$R_{NiCr\ RTD} = R_{0,NiCr\ RTD}(1 + TCR_{NiCr} \cdot \Delta T + GF_{NiCr} \cdot \Delta \epsilon + \Delta CTE_{NiCr} \cdot \Delta T \cdot GF_{NiCr})$$

Herein, $R_{0,Pt\ RTD}$ and $R_{0,NiCr\ RTD}$ are the reference resistances. From a given set of resistance measurements on two RTDs, the strain and temperature changes can be extracted according to:

$$\Delta \epsilon = \frac{\left(\frac{R_{NiCrRTD}}{R_{0,NiCrRTD}} - 1 - \frac{TCR_{NiCr} + \Delta CTE_{NiCr} \cdot GF_{NiCr}}{TCR_{Pt} + \Delta CTE_{Pt} \cdot GF_{Pt}} \cdot \frac{R_{PtRTD}}{R_{0,PtRTD}} + \frac{TCR_{NiCr} + \Delta CTE_{NiCr} \cdot GF_{NiCr}}{TCR_{Pt} + \Delta CTE_{Pt} \cdot GF_{Pt}}\right)}{GF_{NiCr} - GF_{Pt} \frac{TCR_{NiCr} + \Delta CTE_{NiCr} \cdot GF_{NiCr}}{TCR_{Pt} + \Delta CTE_{Pt} \cdot GF_{Pt}}}$$

$$\Delta T = \frac{GF_{NiCr}\left(\frac{R_{PtRTD}}{R_{0,PtRTD}} - 1\right) - GF_{Pt}\left(\frac{R_{NiCrRTD}}{R_{0,NiCrRTD}} - 1\right)}{GF_{NiCr}(TCR_{Pt} + \Delta CTE_{Pt} \cdot GF_{Pt}) - GF_{Pt}(TCR_{NiCr}TCR_{NiCr} + \Delta CTE_{NiCr} \cdot GF_{NiCr})}.$$

Based on the measured strain, the target filter phase (or other target filter parameters) can be computationally corrected prior to comparison with the measured filter phase. As with corrections for temperature changes, strain-based computational corrections may be implemented with processing logic and/or a pre-computed look-up table of correction coefficients or strain-dependent target parameters/settings.

Combining corrections for temperature and isotropic strain changes, a correction $\Delta \phi$ for the AMZI target filter phase can be calculated using:

$$\Delta \phi(\Delta T, \Delta \epsilon) = [\beta_1 \Delta L + \Delta l(\beta_1 - \beta_2)] \cdot (1 + \Delta \epsilon),$$

where $\beta_1$ and $\beta_2$ are functions of temperature. For anisotropic strain that is different between the X and Y directions, the correction is based on two values $\Delta \epsilon_x$ and $\Delta \epsilon_y$ measured with two respective strain gauges, each aligned with the respective axis. In embodiments where strain- and temperature-based adjustments are pre-computed, the look-up table may include separate sets of correction coefficients for temperature-based and strain-based adjustments, or store adjust target parameters or settings for a range of combinations of temperature and strain values. Tuning the light source to a target filter phase adjusted based on the measured temperature and strain is akin to reading off the accrued error at a given temperature and wavelength (e.g., using the relation depicted in FIG. 6) or a given strain and wavelength, and adjusting the frequency position of the laser by that error.

As will be appreciated, temperature- and strain compensation as described above are generally applicable to any AMZI-based wavelength lockers, including, but not limited to, wavelength lockers with 90-degree hybrid receivers or active tuning elements as disclosed herein.

Wavelength Locker Calibration and Operation

Figure 7A:
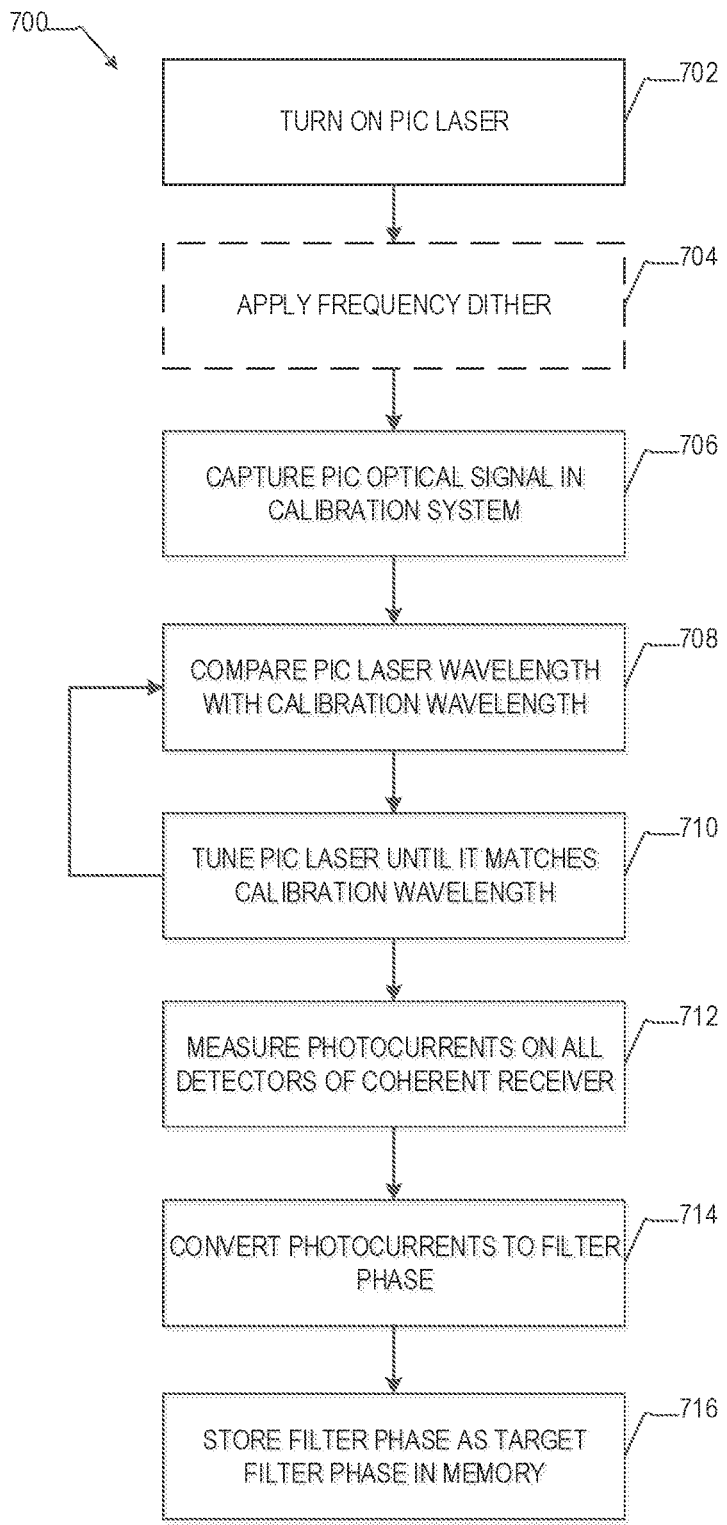
FIG. 7A is a flow chart illustrating an example method for calibrating an integrated wavelength locker with a coherent receiver, in accordance with various embodiments.

With reference to FIGS. 7A-8B, example methods of calibrating and operating integrated wavelength lockers in accordance with various embodiments will now be described. FIG. 7A illustrates an example calibration method 700 for a wavelength locker including a coherent (e.g., 90-degree hybrid) receiver. Once the PIC laser is turned on (act 702) and, optionally, after a unique frequency dither has been applied for AC detection, which may serve to decrease the noise level (act 704), the optical signal of the PIC laser is captured in a calibration system (act 706), such as an external (i.e., off-chip) wavelength filter or wavelength measurement system, which may include a reference laser, providing a calibration wavelength that corresponds to the desired locking wavelength. A power splitter may, for example, route a known fraction of the laser output off-chip, while the remainder of the laser output is coupled into the on-chip wavelength locker. The PIC laser wavelength is compared with the calibration wavelength (act 708), and then tuned until a match with the calibration wavelength has been achieved (act 710). In this state, the photocurrents on all detectors of the coherent receiver (or the multiple coherent receivers in multi-stage wavelength lockers) are measured (act 712) and computationally converted to a filter phase (or multiple filter phases for multiple respective stages) (act 714). The filter phase(s) are stored in (e.g., on-chip) memory associated with the wavelength locker (act 716). Alternatively to using the PIC laser itself, the wavelength locker may be calibrated using an external reference laser emitting light at the desired locking wavelength.

Figure 7B:
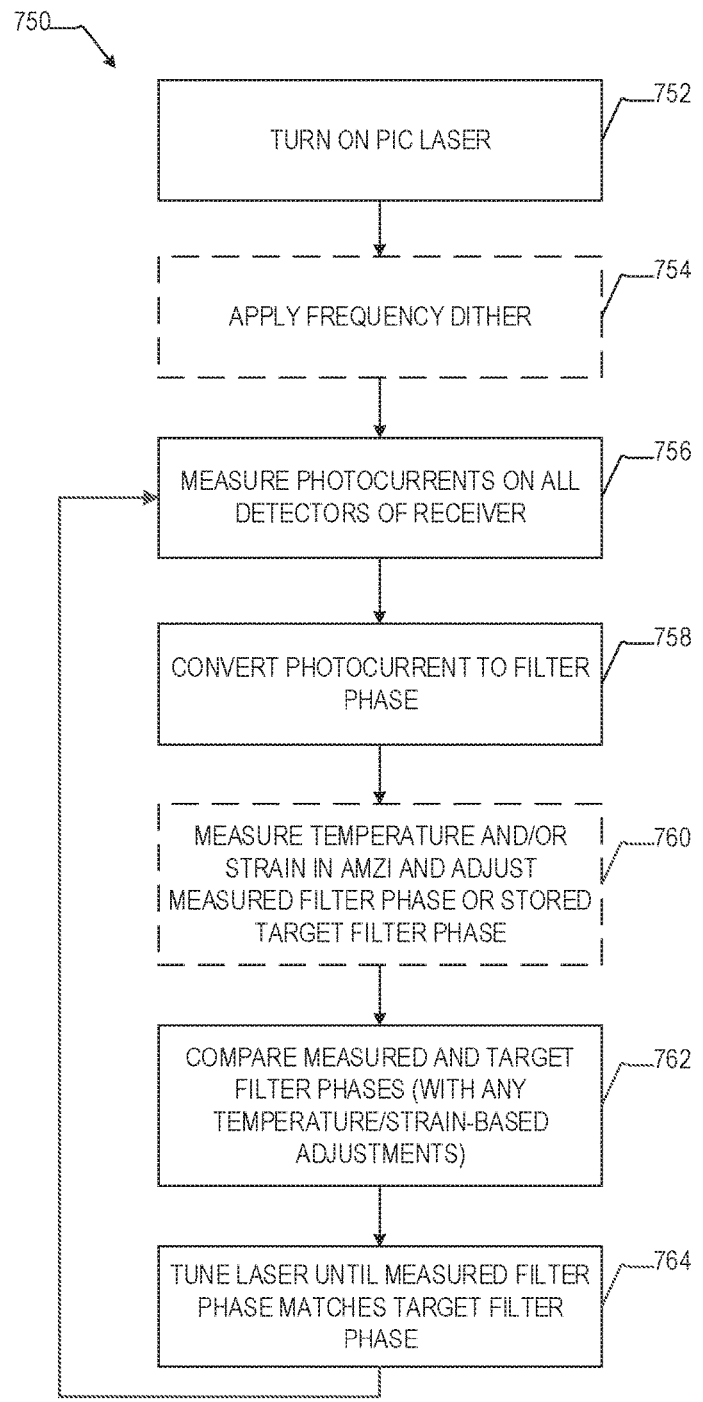
FIG. 7B is a flow chart illustrating an example method for operating an integrated wavelength locker with a coherent receiver, in accordance with various embodiments.

FIG. 7B illustrates a method 750 for using a wavelength locker with a coherent receiver, calibrated in accordance with the method 700 of FIG. 7A, for wavelength stabilization. Once the PIC laser is turned on (act 752) and, optionally, a frequency dither has been applied (act 754), the photocurrents on all detectors of the coherent receiver are measured (act 756) and computationally converted to a filter phase (hereinafter the "measured filter phase," to distinguish from the target filter phase) (act 758). Optionally, the temperature and/or strain in the AMZI are measured and used to adjust either the measured filter phase or the stored target filter phase (act 760). Following any such adjustment, the measured filter phase is compared with the target filter phase (act 762), and the PIC laser is tuned until the measured filter phase matches the target filter phase (act 764). In embodiments with multiple filter stages, the process is repeated for each stage, going from coarser to finer filters. To keep the laser wavelength locked over an extended period of time, measurements of the filter phase (acts 756, 758) and laser tuning based on comparison against the target filter phase (following temperature- or strain-based adjustments, if applicable) (acts 760, 762, 764) may be repeated continuously or at regular or otherwise specified time intervals. As will be appreciated, the various acts of the method 750 need not all be performed in the exact order depicted. For example, measurements of the temperature and/or strain in the AMZI and target-phase adjustments based thereon may precede determination of the measured filter phase. Further, to the extent the temperature and strain can be assumed to be constant during a period of operation, their measurement and the target-phase adjustments need not be repeated during each iteration.

Figure 8A:
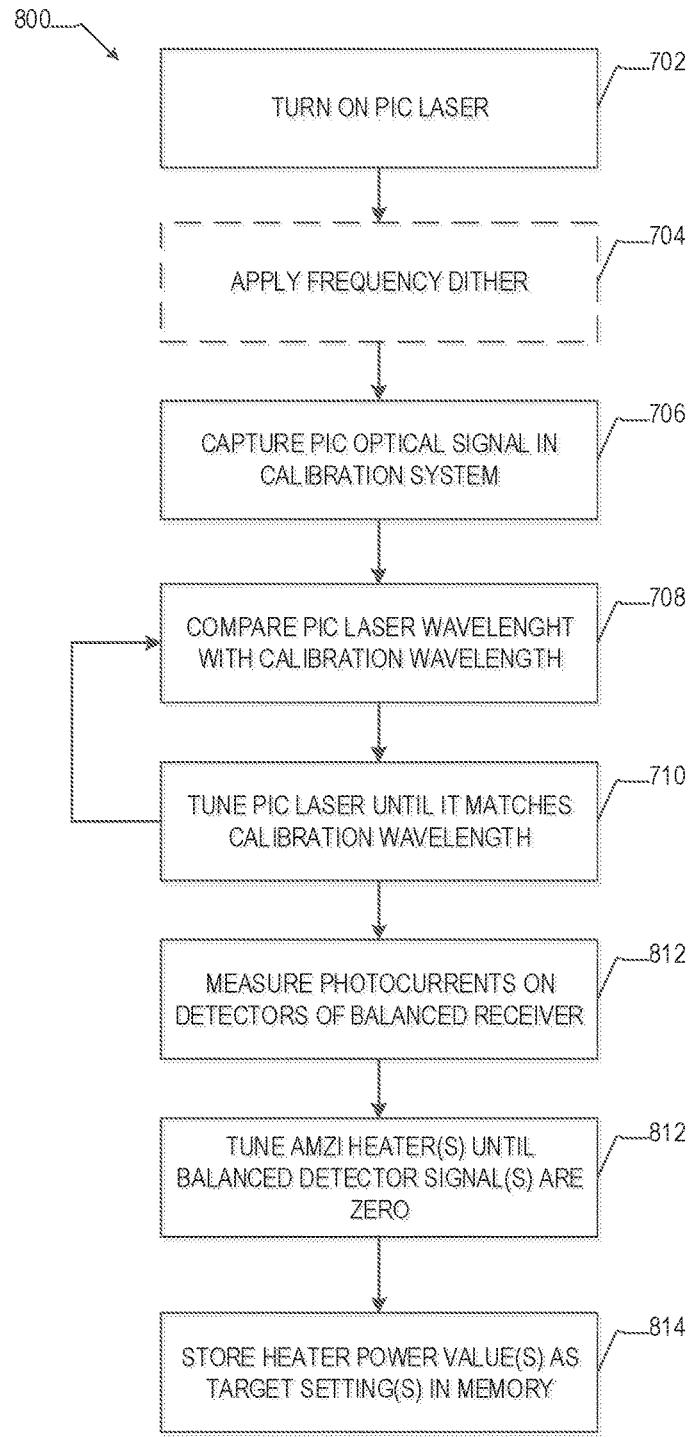
FIG. 8A is a flow chart illustrating an example method for calibrating an integrated wavelength locker with an AMZI including a heater in one interferometer arm, in accordance with various embodiments.

FIG. 8A illustrates an example calibration method 800 for an integrated wavelength locker with an active tuning element. Once the PIC laser is turned on (act 702), and, optionally, after a unique frequency dither has been applied for AC detection (act 704), the optical signal of the PIC laser is captured in a calibration system (act 706) and compared in wavelength against a calibration wavelength (act 708), and the PIC laser is tuned until its wavelength matches the calibration wavelength (act 710), in the same manner as in method 700 (FIG. 7A) for wavelength lockers with coherent receivers. Further, the photocurrents on the detectors of the balanced receiver are measured (act 812). Instead of converting the measured photocurrents to a filter phase, however, they are used to tune the heater (or other active tuning element) in the AMZI until the corresponding balanced detector signal is zero (act 812), which occurs at the maximum slope, i.e., point of highest sensitivity, of the filter. The heater power value and any other tuned heater settings are stored as target settings in memory (act 814). In multi-stage wavelength lockers, the heater settings of heaters in all AMZIs can be adjusted, e.g., going from coarsest to finest filter, to achieve zero balanced photocurrents on all stages. The multiple stages can be tuned nearly independently from one another, where a small amount of thermal cross-talk may cause some very minor interaction between the stages. If cross-talk effects have a significant effect on the accuracy due to proximity of the multiple stages, the calibration process can be repeated after the first iteration to compensate for these thermal effects. In each iteration, the thermal adjustments become smaller and the cross-talk eventually becomes negligible. Alternatively, each stage can be operated with independent close-loop feedback to converge all stages to zero balanced photocurrent at the same time.

Figure 8B:
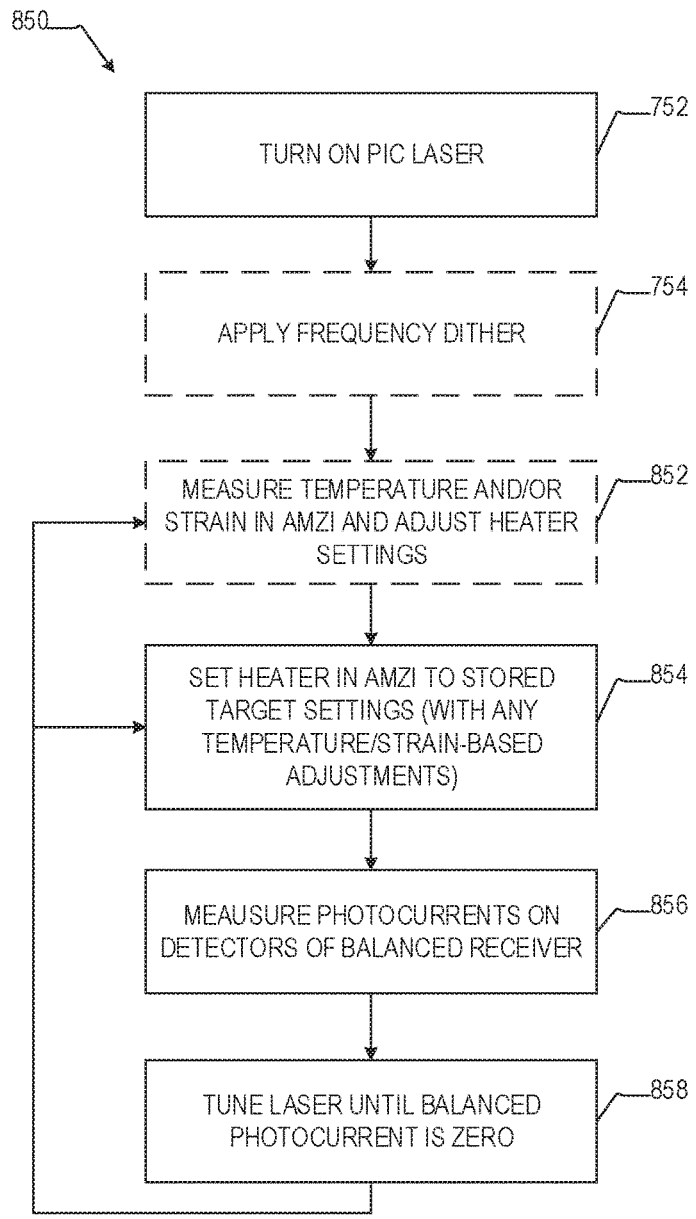
FIG. 8B is a flow chart illustrating an example method for operating an integrated wavelength locker with an AMZI including a heater in one interferometer arm, in accordance with various embodiments.

FIG. 8B illustrates a method 850 for using a wavelength locker with an active tuning element, calibrated in accordance with the method of FIG. 8A, for wavelength stabilization. The PIC laser is turned on (act 752), a frequency dither is optionally applied (act 754), and then the heater in the AMZI is set to the power value or other target settings stored in memory (act 854), following optional adjustment of the target settings based on measurements of the temperature and/or strain of the AMZI (act 852). The temperature sensor is placed sufficiently far from the heater that the thermal cross-talk between the two is minimal and hence the temperature sensor records the ambient temperature of the PIC and not the heater; in certain embodiments, this can be achieved by placing the temperature sensor near the opposite AMZI arm as the heater. The photocurrents on the detectors of the balanced receiver are then measured (act 856) and provided as feedback to tune the PIC laser until the balanced photocurrent is zero (act 858). In embodiments with multiple filter stages, the stages are tuned sequentially, from coarsest to finest filter, by measuring the temperature and/or strain in the respective AMZI (if applicable), adjusting the respective heater to its stored target settings, and tuning the laser until the balanced photocurrent measured with the respective receiver is zero (acts 852-858). When tuning the laser, the heater(s) of any coarser stage(s) may be left turned on during optimization of the finer stage(s). Alternatively, it is possible to tune a filter stage having only the heater of that stage turned on, which reduces power consumption and avoids cross talk. Photocurrent measurements and laser tuning may continue (acts 856, 858), or be repeated at specified intervals, to maintain the locking position. Depending on the stability of temperature and strain, their measurement and adjustment based thereon (acts 852, 854) may be, but need not be, repeated during each iteration.

Summarizing the above-described methods, wavelength locking in accordance herewith generally involves measuring photocurrents with the detectors of the wavelength locker, and, using the electronic processing circuitry, tuning the frequency of the light coupled into the AMZI to satisfy a certain locking condition. The locking condition may vary depending on the type of wavelength locker. In wavelength lockers without an active tuning element in the AMZI, the locking condition may involve a match between a filter phase or other filter parameter derived from the measured photocurrents and a target filter phase or other target filter parameter, respectively, as stored during calibration. In wavelength lockers with an active tuning element, such as a heater, in the AMZI, the locking condition may be that, when the active tuning element is tuned to stored target settings (e.g., a target heater power), the measured photocurrents assume specified values, e.g., balanced photocurrents are substantially (i.e., within the margins of error associated with the measurement) zero. In either case, a feedback parameter derived from the measured optical interference signals—e.g., a filter phase computed from the optical interference signals, or the balanced photocurrent itself—is used to tune the laser until the locking condition is satisfied. In some embodiments, a parameter of the locking condition, such as a target parameter or target setting, is adjusted based on a measured temperature and/or strain in the AMZI.

PIC Manufacturing and Packaging

Wavelength lockers as described above can be manufactured along with the light source to be wavelength-locked on a single PIC chip using a suitable sequence of etch and deposition steps. The memory storing the target filter phase(s) and/or target setting(s) and the electronic circuitry used to process the optical interference signals to tune the on-chip light source based on the stored target filter phase(s) or setting(s) and the measurements may be implemented on a separate electronic control chip (or multiple chips), and both the PIC chip and the electronic control chip(s) may be bonded (e.g., bump-bonded or wire-bonded) or otherwise attached to a unifying substrate to form a multi-chip module or "package." Alternatively, the memory and electronic circuitry may be implemented on the PIC chip itself, or vertically integrated with the PIC chip. It is also possible to provide the memory and/or electronic circuitry in a separate device electrically connected to the PIC, e.g., a general-purpose computer with a hardware processor and associated memory that executes suitable software to provide the signal-processing functionality. Further, processing functionality and stored data may be split between on-chip and off-chip circuitry and memory.

Figure 9:
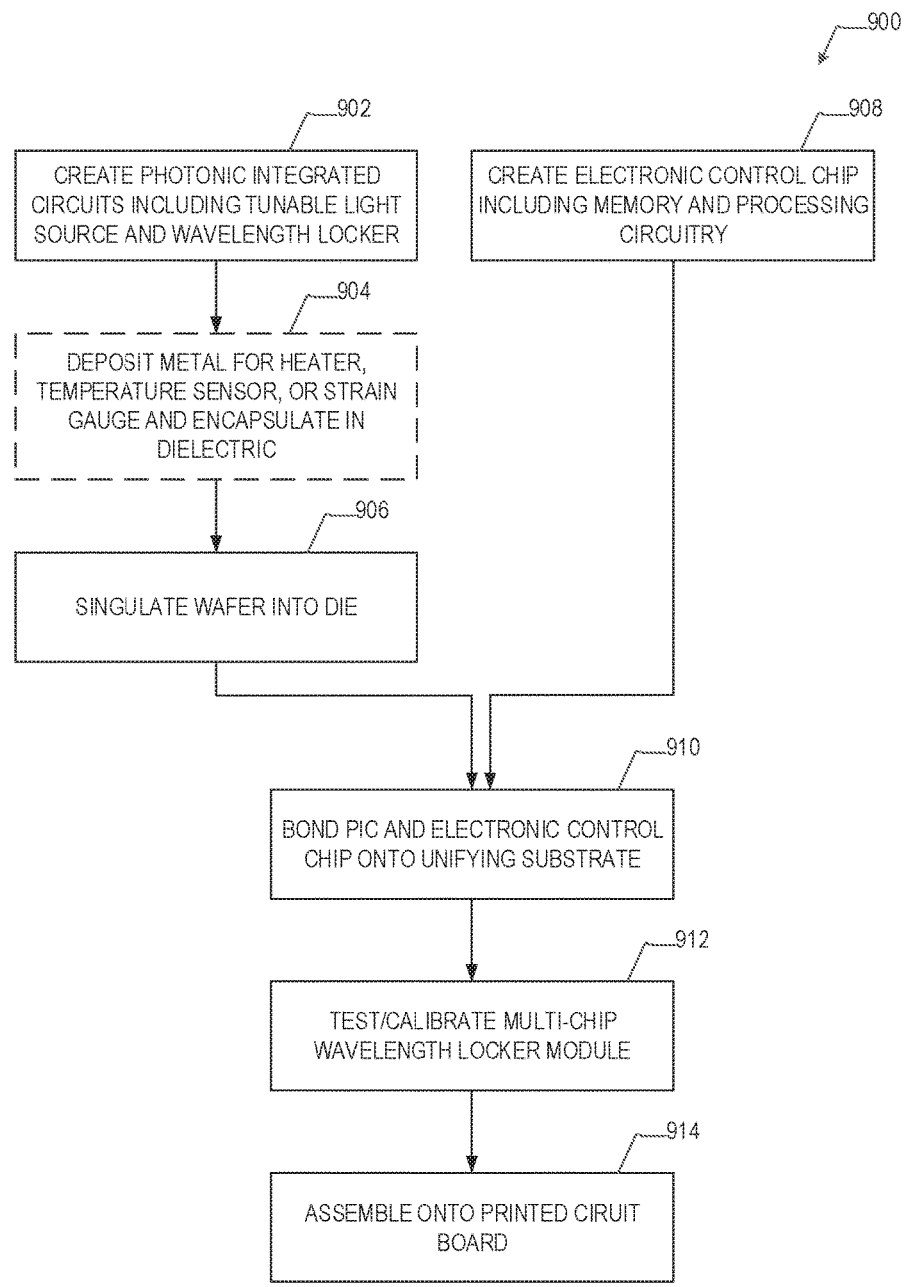
FIG. 9 is a flow chart illustrating an example method of manufacturing and assembling a multi-chip integrated wavelength locker module, in accordance with various embodiments.

FIG. 9 illustrates, in the form of a flow chart, an example method 900 of manufacturing and assembling a multi-chip integrated wavelength locker module in accordance with various embodiments. Various steps of the method 900 are further illustrated in FIGS. 10A-10D. The method 900 begins, in act 902, with the creation of a PIC including a tunable light source and the optical components of an integrated wavelength locker on a semiconductor substrate, such as, e.g., a silicon-on-insulator (SOI) substrate or a compound semiconductor substrate. The details of PIC creation and the resulting PIC structure generally vary depending on the type of substrate. In general, the process may involve a series of lithographic (e.g., photolithographic) patterning, etching, and deposition (including, e.g., epitaxial growth) steps.

Figure 10A:
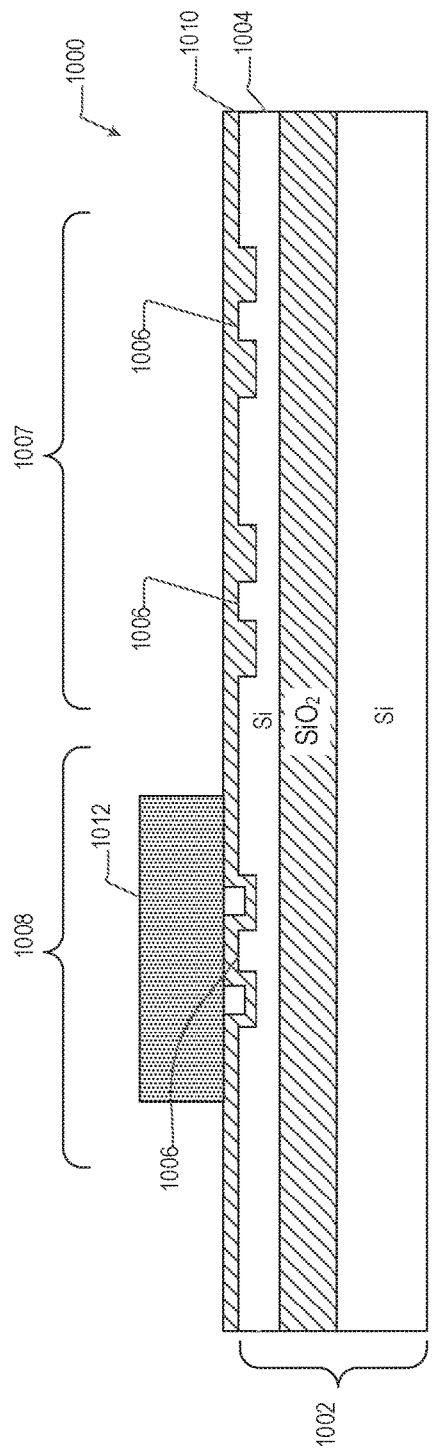
FIG. 10A is a schematic cross-sectional view of an example implementation of a PIC with an integrated wavelength locker on a silicon-on-insulator (SOI) substrate, in accordance with various embodiments.

With reference to FIG. 10A, implementation of a PIC 1000 on an SOI substrate 1002 (which includes layers of silicon, silicon oxide, and silicon) is shown in cross-sectional view. The top silicon layer 1004 of the SOI substrate 1002 is patterned and then partially etched to form the waveguides and other integrated optical structures 1006 of the AMZI (including the output coupler) in region 1007 and of a laser diode and associated modulator (used to send data and optionally apply a low frequency dither signal to the laser) and photodiodes (serving as the detectors) in region 1008. The laser can be tuned using semiconductor material in region 1008 to exploit linear and/or quadratic electro-optic effects or carrier injection (via free carrier absorption, bandgap shrinkage, band filling effects), or by a thermal tuning element in region 1007 placed within the laser cavity. The output coupler may be, for example, an MMI that takes the form of a rectangle (in top view, e.g., as shown in FIG. 3A) that merges into the (narrower, and optionally tapered) waveguides at the input and output ports. The dimensions of the rectangular MMI and the positions of the inputs and outputs are chosen such that specified phase shifts are imparted between the two waves originating at the input ports and interfering at one of the outputs; these phase shifts generally differ between the output ports. For a 90-degree hybrid receiver, for example, the output coupler may be configured such that the phase shifts between the two interfering signals are 0°, 90°, 180°, and 270° at the four output ports, respectively. (The same filter-phase information can be obtained if the four relative phase shifts are all shifted by the same additional phase offset.) On top of the patterned and etched silicon layer, an insulating layer of silicon-oxide may be deposited to form a cladding 1010. In the region 1008 of the laser and detectors, on top of the cladding 1010 above the integrated optical structures of these components, compound semiconductor material 1012 including n-doped and p-doped regions is deposited to form the laser diodes, modulators, and photodiodes; typically, the compound semiconductor includes multiple different materials bonded to the surface and optimized for each function. Pad metal and metal contacts (not shown) are deposited to facilitate applying a current through the laser diode to cause stimulated emission, applying a current or voltage to laser tuning elements, generating a variable electric field across the modulator to transmit data and optionally provide dither for the wavelength locker, and measuring currents generated in the photodiodes. Light created in the laser diode is coupled into the integrated optical structures beneath, which may form a resonant cavity with an output coupler leading to the modulator, optional optical switches and power dividers, and then the input of the AMZI. Light from the output ports of the output coupler of the wavelength locker is coupled into the compound semiconductor of the photodiodes.

Figure 10B:
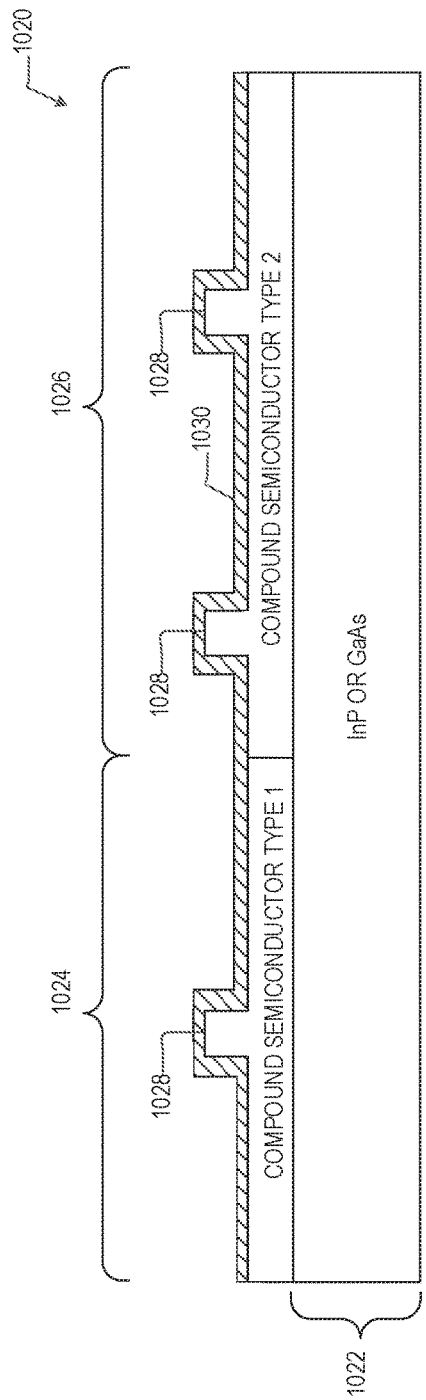
FIG. 10B is a schematic cross-sectional view of an example implementation of a PIC with an integrated wavelength locker on a compound semiconductor substrate, in accordance with various embodiments.

FIG. 10B illustrates, likewise in cross-sectional view, an alternative implementation of a PIC 1020 on a compound semiconductor substrate 1022, such as, e.g., InP or GaAs. The PIC 1020 includes, deposited on the substrate 1022, a variety of active regions of a first type (collectively first region 1024) that are used for the laser diode, the modulator, and the photodiodes (where different types of materials of the first type may be used for the different respective components), and a region of a second type (indicated as second region 1026) that is used for the AMZI (including the output coupler) of the wavelength locker. The regions of the first type are doped compound semiconductors. The region(s) of the second type (used for tuning the AMZI) are either doped compound semiconductor or un-doped compound semiconductor with a thermal tuner deposited on the surface. To create this PIC 1020, compound semiconductor material of the first type is epitaxially grown over the whole surface of the substrate 1022. A suitable masking material, such as an oxide or nitride, is then deposited over the surface and lithographically protected in the first region 1024. In the second region 1026, the masking material and the semiconductor material of the first type are etched away to expose the bare substrate 1022 or a suitable growth buffer layer. Thereafter, compound semiconductor material of the second type is epitaxially grown in the exposed second region 1026. The masking material covering the first region 1024, and any material of the second type deposited thereon, may then be removed. To create multiple regions of the first type (as sub-regions of the first region 1024), the process of epitaxially growing material over the entire surface, masking it where desired, and etching it away in the remaining regions (e.g., the second region) may be repeated, prior or subsequently to depositing the material of the second type, as needed. Further, each region (or sub-region) of the first or second type may be lithographically patterned and etched when exposed. For example, ridge waveguides and wave-confining structures 1028 of the laser, detectors, and wavelength locker are lithographically defined and etched in the second region 1026. Finally, a cladding layer 1030 (e.g., silicon nitride or silicon oxide) is disposed above the surface, and pad metal and metal contacts are defined and deposited (the exact order of steps varying depending on the particular manufacturing process). In this embodiment, light is generated, modulated, routed, and detected in the integrated optical structures 1028 formed.

Figure 10C:
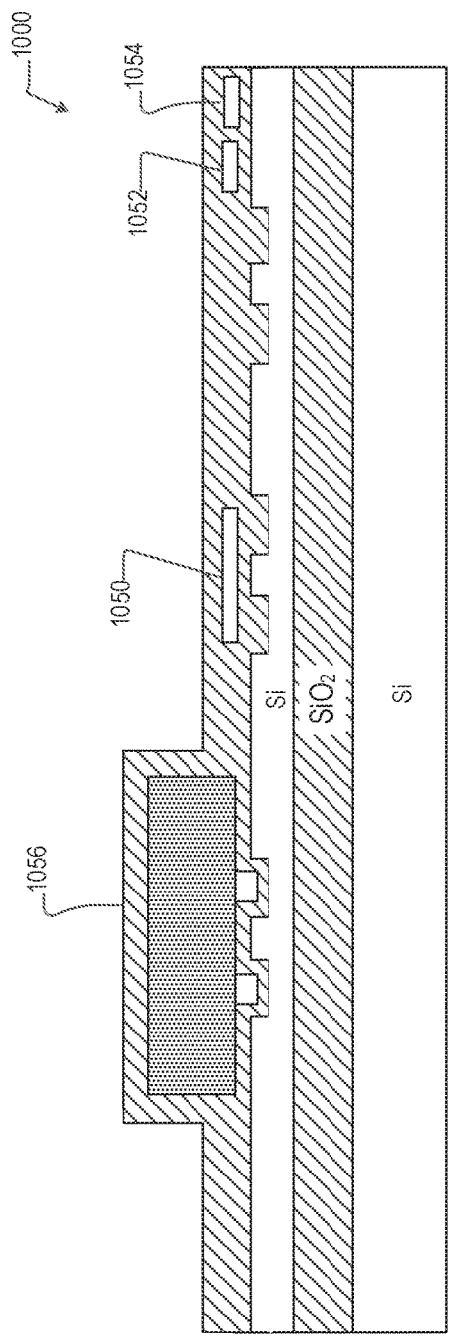
FIG. 10C is a schematic cross-sectional view of the example implementation of a PIC with an integrated wavelength locker of FIG. 10A, further illustrating metal deposits for a heater and sensors, in accordance with various embodiments.

Returning to the description of FIG. 9, in embodiments that include a heater, temperature sensor, and/or strain gauge in the AMZI, a series of additional metal deposition steps follow the creation of the integrated optical structures of the wavelength locker (904). With reference to FIG. 10C (which shows the SOI implementation of PIC 1000), to create a heater 1050 for thermally tuning the AMZI, a metal with a high melting point, such as, e.g., tungsten (W), is deposited above one of the waveguide arms of the MZI, e.g., in the form of a continuous patch or winding trace. To monitor the temperature and/or strain in the AMZI, metals for a temperature sensor 1052 and strain gauge 1054 are deposited in the vicinity of the AMZI. For the temperature sensor 1052, a metal with a high TCR (e.g., exceeding 1000 ppm/° C.), such as, e.g., platinum, is used, and for the strain gauge 1054, a second metal with a low-TCR (e.g., below 100 ppm/°), such as, e.g., nickel chromium, is added. The metal deposits for the heater 1050, temperature sensor 1052, and/or strain gauge 1054 are encapsulated in a dielectric 1056. All electrical components are connected to thick metal traces (e.g., made of gold or silver) through vias in the encapsulation dielectric. These thick metal traces allow connection of the integrated components to external electronics such as probe cards and wirebonds. In some embodiments, copper micropillars or posts are added on the surface of the PIC 1000 and attached to the thick metal traces. These copper micropillars extend between 10 μm and 100 μm from the surface of the PIC 1000; they have solder deposited on their top surface, and they have additional dielectric or polymer encapsulation around their base at the metal trace interface. The micropillars may be connected to electrical pads on organic substrates, which can then be attached to a printed circuit board (PCB) through ball grid arrays patterned on the organic substrates. This stack allows electrical connection from the PCB to the PIC components.

Figure 10D:
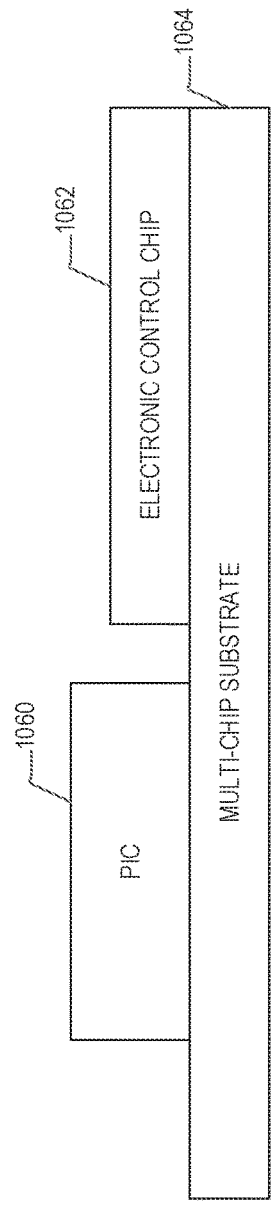
FIG. 10D is a simplified schematic cross-sectional view of a multi-chip module including a PIC and electronic control chip, in accordance with various embodiments.

With renewed reference to FIG. 9, the PICs with integrated wavelength lockers may be mass-manufactured by creating large numbers of them simultaneously on a single semiconductor wafer in a regular arrangement (e.g., a square grid). Following creation of the PICs (act 902 and, optionally, act 904), the wafer is singulated into dies (or chips) corresponding to the individual PICs, e.g., by dicing along the grid lines (906). Electronic control chips including memory and processing circuitry for processing the optical interference signals may be created independently from the PICs (act 908); suitable manufacturing processes for electronic integrated circuits are well-known to those of ordinary skill in the art. The PIC and electronic control chip may then be assembled into a multi-chip module or package. For instance, as schematically shown in FIG. 10D, the PIC 1060 and electronic control chip 1062 may be bonded side-by-side to a unifying multi-chip substrate 1064 (act 910). In some embodiments, the PIC 1060 and electronic control chip 1062 are flip-chip attached to the substrate 1064, that is, they are mounted face-down and aligned such that solder bumps on pad metals of the chips are brought in contact with electrical connectors on the multi-chip substrate. In other embodiments, the PIC 1060 and electronic control chip 1062 are mounted face-up on the substrate 1064, and electrical connections are made through wire-bonding. Assembly of the PIC 1060 on the multi-chip substrate 1064 often results in strain changes in the wavelength locker.

Once the multi-chip integrated wavelength locker module has been assembled, it is ready for testing and calibration of the wavelength locker (act 912). For this purpose, the multi-chip substrate 1064 may be fit into a mating socket of a fixed-temperature test bed. Calibration may utilize an external reference laser operating at the wavelength of interest to couple light into the wavelength locker. Alternatively, light from the on-chip light source may be power-split, and one portion may be sent to the wavelength locker while the other portion may be routed off-chip to an external passive wavelength filter (e.g., Fabry-Perot filter) or high-resolution wavelength measurement system (e.g., a more complex spectrometer); this allows tuning the on-chip light source to the wavelength of interest and then calibrating the wavelength locker to the on-chip light source. Either way, the light is measured on the photodetectors of the wavelength locker. In some embodiments, the measured photocurrents or one or more filter parameters (such as a target filter phase) computed therefrom, are stored in the on-chip memory. Alternatively, in embodiments with a heater (or similar active tuning element), that heater is tuned until the measured photocurrents have reached the desired values (e.g., until a measured balanced photocurrent is substantially zero), and the corresponding heater setting (e.g., heater power) is stored in the on-chip memory. The resistance values of the temperature sensor and strain gauge (if present) are likewise stored in the memory. Following successful calibration, the multi-chip module is assembled onto a PCB or high-density interconnection substrate (act 914) to form an optical assembly suitable for integration into the device where it is ultimately employed (such as, e.g., a data center transceiver, a telecommunications transceiver, fiber-optic router, a sensor system, or a medical laser). The PCB may include, for example, connectors for input/output signals of the optical assembly, circuitry to create power supplies of different voltages from a single-voltage off-chip source, and/or one or more capacitors. Assembly on the PCB can, again, change the strain in the wavelength locker; to the extent the PIC includes a strain gauge, any such change can be computationally compensated for as described above. Testing and calibration immediately following integration of the PIC and electronic control chip into the multi-chip module (which is the first time all components of the wavelength locker are assembled), prior to completion of assembly on the PCB, serves to discover and eliminate any devices that fail as early in the manufacturing process as possible to limit cost.

Example Embodiments

Having described different aspects and features of wavelength lockers and associated methods of manufacture and use, the following numbered examples are provided as illustrative embodiments.

1. A system comprising: an integrated photonic circuit (PIC) comprising a tunable light source, and a wavelength locker comprising an asymmetric Mach-Zehnder interferometer (AMZI) with an output coupler having a plurality of output ports and, placed at the plurality of output ports, a plurality of respective photodetectors for measuring respective optical interference signals exiting the plurality of output ports when light is coupled from the light source into the AMZI, wherein the output coupler and the plurality of photodetectors are configured as a coherent receiver in which relative phase shifts imparted between two signals being interfered to form the optical interference signals differ between at least two of the output ports by a value that is not a multiple of 180°; memory storing one or more target filter parameters associated with a specified locking frequency of the light source; and electronic processing circuitry configured to compute one or more filter parameters from the measured optical interference signals and tune a frequency of the light source until the one or more computed filter parameters match the one or more target filter parameters.

2. The system of example 1, wherein the AMZI and the plurality of photodetectors form a first filter, the wavelength locker further comprising a second filter including a second AMZI with an output coupler having a plurality of output ports and a second plurality of respective photodetectors placed at the output ports, the output coupler of the second AMZI and the second plurality of photodetectors being configured as a second coherent receiver, wherein a filter period of the first filter is greater than a filter period of the second filter and a frequency error of the first filter is smaller than the filter period of the second filter.

3. The system of example 2, wherein the filter period of the first filter is at least five times greater than the filter period of the second filter.

4. The system of anyone of examples 1-3, wherein the wavelength locker is capable of locking the frequency of the light source within 50 GHz or less.

5. The system of example 4, wherein the wavelength locker is capable of locking the frequency of the light source across a range of at least 200 GHz.

6. The system of any one of examples 1-5, wherein the output coupler has four output ports and the wavelength locker comprises four respective photodetectors, and wherein the output coupler and the four photodetectors are configured as a 90-degree hybrid optical receiver measuring balanced in-phase and quadrature signals.

7. The system of any one of examples 1-5, wherein the output ports and the respective photodetectors form a plurality of balanced receiver pairs.

8. The system of any one of examples 1-7, wherein the PIC and an electronic control chip including the memory and the electronic processing circuitry are bonded to a single substrate to form a multi-chip module.

9. The system of any one of examples 1-8, wherein the AMZI is athermal.

10. The system of any one of examples 1-9, wherein the wavelength locker further comprises at least one of a temperature sensor for measuring a temperature of the AMZI or a strain gauge for measuring a strain in the AMZI, wherein the electronic processing circuitry is configured to adjust the one or more target filter parameters based on a measured temperature or strain, or wherein the memory stores multiple temperature-dependent or strain-dependent sets of target filter parameters.

11. A method for locking a frequency of a light source of a photonic integrated circuit using an integrated wavelength locker comprising an AMZI, the method comprising: coupling light from the light source into the AMZI at an input of the AMZI; measuring, at an output of the AMZI, a plurality of optical interference signals each resulting from interference of two signals, wherein a relative phase shift imparted between the two interfering signals differs between at least two of the optical interference signals by a value that is not a multiple of 180°; determining one or more filter parameters from the measured optical interference signals; and tuning a frequency of the light source until the determined one or more filter parameters match one or more corresponding stored target filter parameters associated with a specified locking frequency.

12. The method of example 11, wherein the AMZI forms part of a first filter, the wavelength locker comprising a second filter with a second AMZI, a filter period of the second AMZI being smaller than a filter period of the first AMZI, the frequency of the light source being tuned with the first filter to match the one or more stored target filter parameters within a margin of error corresponding to a frequency error no greater than the filter period of the second AMZI, the method further comprising, following coarse-tuning the frequency of the light source with the first filter, fine-tuning the frequency of the light source with the second filter by: coupling light from the light source into the second AMZI at an input of the second AMZI; measuring, at an output of the second AMZI, a plurality of optical interference signals each resulting from interference of two signals, wherein a relative phase shift imparted between the two interfering signals differs between at least two of the optical interference signals by a value that is not a multiple of 180°; determining one or more filter parameters of the second AMZI from the measured optical interference signals; and tuning the frequency of the light source until the one or more determined filter parameters of the second AMZI match one or more corresponding stored target filter parameters of the second AMZI within a margin of error corresponding to a frequency error smaller than the frequency error associated with the first filter.

13. The method of example 11 or example 12, wherein the measured optical interference signals comprise in-phase and quadrature signals.

14. The method of any one of examples 11-13, wherein the measured optical interference signals comprise pairs of balanced signals.

15. The method of any one of examples 11-14, further comprising measuring at least one of a temperature of the AMZI or a strain in the AMZI, and adjusting the one or more target filter parameters based on the measured temperature or strain prior to comparison with the one or more filter parameters determined from the measured optical interference signals.

16. The method of any one of examples 11-15, wherein the frequency of the light source is locked within 50 GHz or less.

17. A method of manufacturing a multi-chip integrated wavelength locker module, the method comprising: on a semiconductor substrate, creating a photonic integrated circuit (PIC) comprising a tunable light source and a wavelength locker, the wavelength locker comprising an asymmetric Mach-Zehnder interferometer (AMZI) with an output coupler having a plurality of output ports and, placed at the plurality of output ports, a plurality of respective photodetectors for measuring respective optical interference signals exiting the at least two output ports when light is coupled from the light source into the AMZI, wherein the output coupler and the plurality of photodetectors are configured as a coherent receiver in which relative phase shifts imparted between two signals being interfered to form the optical interference signals differ between at least two of the output ports by a value that is not a multiple of 180°; creating an electronic control chip including memory and processing circuitry configured to compute a filter phase from the measured optical interference signals and tune a frequency of the light source until the computed filter phase matches a target filter phase corresponding to a specified locking frequency; and bonding the PIC and the electronic control chip to a common substrate to form the multi-chip integrated wavelength locker module.

18. The method of example 17, further comprising calibrating the wavelength locker by: providing a reference signal having the specified locking frequency to an input of the AMZI, measuring optical interference signals at the plurality of photodetectors and output port of the AMZI and computationally converting the measured optical interference signals to a filter phase, and storing the filter phase as the target filter phase in memory.

19. The method of example 18, wherein the reference signal is provided by an external light source.

20 The method of example 18, wherein the reference signal is provided by the light source of the PIC following tuning of the light source to the specified locking frequency using an external wavelength filter.

21. A wavelength locker comprising: an athermal asymmetric Mach-Zehnder interferometer (AMZI) comprising an input coupler, two waveguide arms, an output coupler providing at least two output ports, and an active tuning element disposed in one of the waveguide arms and configured to adjust an optical-path-length difference between the two waveguide arms; and, placed at the at least two output ports, at least two respective photodetectors forming, together with the output coupler, a balanced receiver.

22. The wavelength locker of example 21, wherein the AMZI and the photodetectors are integrated in a photonic integrated circuit.

23. The wavelength locker of example 21 or example 22, wherein the active tuning element comprises a heater.

24. The wavelength locker of any one of examples 21-23, further comprising memory storing a target setting of the active tuning element associated with a specified locking frequency.

25. The wavelength locker of example 24, further comprising circuitry configured to set the active tuning element to the target setting, and to tune a frequency of a light source coupling light into the AMZI, based on a balanced photocurrent measured with the balanced receiver, to bring the balanced photocurrent to substantially zero.

26. The wavelength locker of example 24 or example 25, further comprising at least one of a temperature sensor or a strain gauge, the memory storing temperature-dependent or strain-dependent target settings for multiple temperatures of the AMZI or multiple levels of strain in the AMZI, or the wavelength locker further comprising circuitry to adjust the target setting based on a measured temperature or strain.

27. The wavelength locker of any of examples 21-26, wherein the AMZI and the balanced receiver form a first filter, the wavelength locker further comprising a second filter including a second AMZI and a second balanced receiver, wherein a filter period of the first filter is greater than a filter period of the second filter and a frequency error of the first filter is smaller than the filter period of the second filter.

28. The wavelength locker of example 27, wherein a filter period of the first filter is at least five times greater than the filter period of the second filter.

29. A method for locking a frequency of a light source of a photonic integrated circuit using an integrated wavelength locker comprising an AMZI with an active tuning element in one interferometer arm, the method comprising: coupling light emitted by the light source into the AMZI at an input of the AMZI; adjusting a setting of the active tuning element to match a target setting stored in memory, the target setting being associated with a specified locking frequency; measuring a balanced photocurrent at an output of the AMZI; and tuning a frequency of the light source until the measured balanced photocurrent is substantially zero.

30. The method of example 29, wherein the active tuning element comprises a heater and the setting being adjusted comprises a heater power.

31. The method of example 29 or example 30, further comprising measuring at least one of a temperature of the AMZI or a strain in the AMZI, and adjusting the setting of the active tuning element, based on the measured temperature or strain, prior to tuning the frequency of the light source to bring the balanced photocurrent to substantially zero.

32. The method of any one of examples 29-31, further comprising calibrating the integrated wavelength locker prior to locking the frequency of the light source by: tuning the frequency of the light source, based on an external reference signal having the specified locking frequency, until the frequency of the light source matches the specified locking frequency; and, while the frequency of the light source matches the specified locking frequency, tuning the setting of the active tuning element until a balanced photocurrent measured at the output of the AMZI is substantially zero, and then storing that setting as the target setting in memory.

33. The method of any one of examples 29-32, wherein the AMZI forms part of a first filter, the wavelength locker comprising a second filter with a second AMZI, a filter period of the second AMZI being smaller than a filter period of the first AMZI, the frequency of the light source being tuned in the first filter up to a frequency error no greater than the filter period of the second AMZI, the method further comprising, following coarse-tuning the frequency of the light source with the first filter, fine-tuning the frequency of the light source with the second filter by: coupling light emitted by the light source into the second AMZI at an input of the second AMZI; and, while the setting of the active tuning element match the target setting stored in memory, measuring a second balanced photocurrent at an output of the second AMZI and tuning the frequency of the light source until the measured second balanced photocurrent is substantially zero.

34. A method of manufacturing an integrated wavelength locker module, the method comprising: on a semiconductor substrate, creating a PIC comprising a tunable light source and a wavelength locker, the wavelength locker comprising an AMZI with two waveguide arms and a balanced receiver; and depositing a metal above one of the waveguide arms to form an active tuning element for adjusting an optical-path-length difference between the two waveguide arms.

35. The method of example 34, further comprising: creating an electronic control chip including memory storing a target setting of the active tuning element and processing circuitry configured to tune a frequency of the light source coupling light into the AMZI, based on a balanced photocurrent measured with the balanced receiver, to bring the balanced photocurrent to substantially zero; and bonding the PIC and the electronic control chip to a common substrate to form the integrated wavelength locker module.

36. The method of example 35, further comprising calibrating the integrated wavelength locker module by: providing a reference signal having a specified locking frequency to an input of the AMZI; and tuning a setting of the active tuning element until a balanced photocurrent measured with the balanced receiver is substantially zero, and then storing that setting as the target setting in the memory.

37. The method of example 36, wherein the reference signal is provided by an external light source.

38. The method of example 36, wherein the reference signal is provided by the light source of the PIC following tuning of the light source to the specified locking frequency using an external wavelength filter.

39. The method of any one of examples 36-38, further comprising creating a strain gauge in the PIC adjacent the AMZI and, following bonding of the PIC and the electronic control chip to the common substrate, measuring a strain in the AMZI and storing the measured strain in the memory.

40. The method of any one of examples 36-39, further comprising creating a temperature sensor in the PIC adjacent the AMZI, wherein calibrating the integrated wavelength locker module further comprises measuring the temperature of the AMZI and storing the measured temperature in the memory.

41. A wavelength locker comprising: an athermal asymmetric Mach-Zehnder interferometer (AMZI) comprising an input coupler, two waveguide arms, and an output coupler having at least two output ports; placed at the at least two output ports, at least two respective photodetectors for measuring at least two respective optical interference signals exiting the at least two output ports; a temperature sensor to measure a temperature of the AMZI and a strain gauge to measure a strain in the AMZI; and circuitry configured to adjust a locking condition based on the measured temperature and strain, and to tune a frequency of light coupled into the AMZI, based on a feedback parameter derived from the measured optical interference signals, to satisfy the adjusted locking condition.

42. The wavelength locker of example 41, wherein the output coupler and the at least two photodetectors are configured as a coherent receiver in which relative phase shifts imparted between two signals being interfered to form the optical interference signals differ between at least two of the output ports by a value that is not a multiple of 180°, and wherein the feedback parameter is a filter phase and the locking condition is satisfied if the filter phase matches a target filter phase associated with a specified locking frequency, the target filter phase being adjusted based on the measured temperature and strain.

43. The wavelength locker of example 41 or example 42, wherein the output coupler has four output ports and the wavelength locker comprises four respective photodetectors, and wherein the output coupler and the four photodetectors are configured as a 90-degree hybrid optical receiver measuring balanced in-phase and quadrature signals.

44. The wavelength locker of example 41, wherein the AMZI includes in one of the waveguide arms an active tuning element configured to adjust an optical-path-length difference between the two waveguide arms, wherein the at least two photodetectors comprise a pair of photodetectors forming a balanced receiver, wherein the feedback parameter is a balanced photocurrent measured with the balanced receiver, and wherein the locking condition is satisfied if the balanced photocurrent is substantially zero when a setting of the active tuning element matches a target setting associated with a specified locking frequency, the target setting being adjusted based on the measured temperature and strain.

45. The wavelength locker of any one of examples 41-44, wherein the locking condition comprises a target parameter, the wavelength locker further comprising memory storing target parameter values or correction coefficients for a plurality of temperatures and strains, the circuitry configured to select one of the stored target parameter values or correction coefficients based on the measured temperature and strain.

46. The wavelength locker of any one of examples 41-45, wherein the locking condition comprises a target parameter, and wherein the circuitry is configured to computationally adjust a stored target parameter value associated with a nominal temperature and a nominal strain based on the measured temperature and strain using a stored functional dependence of the target parameter on temperature and strain.

47. The wavelength locker of any one of examples 41-46, wherein the strain gauge comprises two resistance temperature detectors made from two respective metals differing in their respective temperature coefficients of resistance.

48. A method for locking a frequency of a light source of a photonic integrated circuit using an integrated wavelength locker comprising an athermal AMZI, the method comprising: coupling light emitted by the light source into the AMZI at an input of the AMZI; measuring at least two optical interference signals at an output of the AMZI; measuring a temperature of the AMZI and a strain in the AMZI; adjusting a locking condition based on the measured temperature and strain; and tuning a frequency of the light, based on a feedback parameter derived from the measured optical interference signals, to satisfy the adjusted locking condition.

49. The method of example 48, further comprising computing a filter phase of the AMZI from the measured optical interference signals, the filter phase constituting the feedback parameter, wherein the locking condition is satisfied by tuning the frequency of the light to cause the filter phase to match a target filter phase associated with a specified locking condition and adjusted based on the measured temperature and strain.

50. The method of example 49, wherein the at least two optical interference signals comprise balanced in-phase and quadrature signals.

51. The method of example 48, further comprising adjusting a setting of an active tuning element included in one waveguide arm of the AMZI to match a target setting associated with a specified locking frequency and adjusted based on the measured temperature and strain, wherein the feedback parameter is a balanced photocurrent resulting from the at least two optical interference signals, and wherein the locking condition is satisfied by tuning the frequency of the light to bring the balanced photocurrent to substantially zero while the setting of the active tuning element matches the target setting.

52. The method of any one of examples 48-51, wherein adjusting the locking condition comprises selecting a value of a target parameter included in the locking condition, among target parameter values stored for a plurality of temperature and strains, based on the measured temperature and strain.

53. The method of any one of examples 48-51, wherein adjusting the locking condition comprises computationally adjusting a value of a target parameter included in the locking condition based on the measured temperature and strain using a stored functional dependence of the target parameter on temperature and strain.

54. The method of any one of examples 48-53, further comprising, prior to use of the wavelength locker for frequency locking, measuring a filter response of the AMZI at multiple wavelengths and temperatures.

55. A method of manufacturing an integrated wavelength locker module, the method comprising: on a semiconductor substrate, creating a PIC comprising a tunable light source and a wavelength locker, the wavelength locker comprising an AMZI with two waveguide arms and at least two photodetectors for measuring at least two respective optical interference signals at an output of the AMZI; and depositing metals near the AMZI to form a strain gauge and a temperature sensor.

56. The method of example 55, wherein, for the strain gauge, two metals having different respective temperature coefficients of resistance are deposited.

57. The method of example 56, wherein the two metals for the strain gauge are platinum and nickel-chromium.

58. The method of any one of examples 55-57, wherein, for the temperature sensor, a metal having a temperature coefficient of resistance above 1000 ppm/C is deposited.

59. The method of any one of examples 55-58, further comprising encapsulating the strain gauge and temperature sensor in a dielectric.

60. The method of any one of examples 55-59, further comprising: creating an electronic control chip including memory storing one or more parameters associated with a locking condition and processing circuitry configured to adjust the one or more parameters based on temperature and strain measurements and to tune a frequency of light coupled into the AMZI, based on a feedback parameter derived from measured optical interference signals, to satisfy the locking condition with the adjusted one or more parameters; and bonding the PIC and the electronic control chip to a common substrate to form the integrated wavelength locker module.

Although embodiments have been described with reference to specific example embodiments, it will be evident that various modifications and changes may be made to these embodiments without departing from the broader scope of the disclosure. Accordingly, the specification and drawings are to be regarded in an illustrative rather than a restrictive sense.

What is claimed is:

1. A system comprising:
an integrated photonic circuit (PIC) comprising
a tunable light source, and
a wavelength locker comprising an asymmetric Mach-Zehnder interferometer (AMZI) with an output coupler having a plurality of output ports and, placed at the plurality of output ports, a plurality of respective photodetectors for measuring respective optical interference signals exiting the plurality of output ports when light is coupled from the light source into the AMZI, wherein the output coupler and the plurality of photodetectors are configured as a coherent receiver in which relative phase shifts imparted between two signals being interfered to form the optical interference signals differ between at least two of the output ports by a value that is not a multiple of 180°;
memory storing one or more target filter parameters associated with a specified locking frequency of the light source; and
electronic processing circuitry configured to compute one or more filter parameters from the measured optical interference signals and tune a frequency of the light source until the one or more computed filter parameters match the one or more target filter parameters.

2. The system of claim 1, wherein the AMZI and the plurality of photodetectors form a first filter, the wavelength locker further comprising a second filter including a second AMZI with an output coupler having a plurality of output ports and a second plurality of respective photodetectors placed at the output ports, the output coupler of the second AMZI and the second plurality of photodetectors being configured as a second coherent receiver, wherein a filter period of the first filter is greater than a filter period of the second filter and a frequency error of the first filter is smaller than the filter period of the second filter.

3. The system of claim 2, wherein the filter period of the first filter is at least five times greater than the filter period of the second filter.

4. The system of claim 1, wherein the wavelength locker is capable of locking the frequency of the light source within 50 GHz or less.

5. The system of claim 4, wherein the wavelength locker is capable of locking the frequency of the light source across a range of at least 200 GHz.

6. The system of claim 1, wherein the output coupler has four output ports and the wavelength locker comprises four respective photodetectors, and wherein the output coupler and the four photodetectors are configured as a 90-degree hybrid optical receiver measuring balanced in-phase and quadrature signals.

7. The system of claim 1, wherein the output ports and the respective photodetectors form a plurality of balanced receiver pairs.

8. The system of claim 1, wherein the PIC and an electronic control chip including the memory and the electronic processing circuitry are bonded to a single substrate to form a multi-chip module.

9. The system of claim 1, wherein the AMZI is athermal.

10. The system of claim 1, wherein the wavelength locker further comprises at least one of a temperature sensor for measuring a temperature of the AMZI or a strain gauge for measuring a strain in the AMZI, wherein the electronic processing circuitry is configured to adjust the one or more target filter parameters based on a measured temperature or strain, or wherein the memory stores multiple temperature-dependent or strain-dependent sets of target filter parameters.

11. A method for locking a frequency of a light source of a photonic integrated circuit using an integrated wavelength locker comprising an AMZI, the method comprising:
coupling light from the light source into the AMZI at an input of the AMZI;
measuring, at an output of the AMZI, a plurality of optical interference signals each resulting from interference of two signals, wherein a relative phase shift imparted between the two interfering signals differs between at least two of the optical interference signals by a value that is not a multiple of 180°;
determining one or more filter parameters from the measured optical interference signals; and
tuning a frequency of the light source until the determined one or more filter parameters match one or more corresponding stored target filter parameters associated with a specified locking frequency.

12. The method of claim 11, wherein the AMZI forms part of a first filter, the wavelength locker comprising a second filter with a second AMZI, a filter period of the second AMZI being smaller than a filter period of the first AMZI, the frequency of the light source being tuned with the first filter to match the one or more stored target filter parameters within a margin of error corresponding to a frequency error no greater than the filter period of the second AMZI, the method further comprising, following coarse-tuning the frequency of the light source with the first filter, fine-tuning the frequency of the light source with the second filter by:
   coupling light from the light source into the second AMZI at an input of the second AMZI;
   measuring, at an output of the second AMZI, a plurality of optical interference signals each resulting from interference of two signals, wherein a relative phase shift imparted between the two interfering signals differs between at least two of the optical interference signals by a value that is not a multiple of 180°;
   determining one or more filter parameters of the second AMZI from the measured optical interference signals; and
   tuning the frequency of the light source until the determined one or more filter parameters of the second AMZI match one or more corresponding stored target filter parameters of the second AMZI within a margin of error corresponding to a frequency error smaller than the frequency error associated with the first filter.

13. The method of claim 11, wherein the measured optical interference signals comprise in-phase and quadrature signals.

14. The method of claim 11, wherein the measured optical interference signals comprise pairs of balanced signals.

15. The method of claim 11, further comprising measuring at least one of a temperature of the AMZI or a strain in the AMZI, and adjusting the one or more target filter parameters based on the measured temperature or strain prior to comparison with the one or more filter parameters determined from the measured optical interference signals.

16. The method of claim 11, wherein the frequency of the light source is locked within 50 GHz or less.

17. A method of manufacturing a multi-chip integrated wavelength locker module, the method comprising:
   on a semiconductor substrate, creating a photonic integrated circuit (PIC) comprising a tunable light source and a wavelength locker, the wavelength locker comprising an asymmetric Mach-Zehnder interferometer (AMZI) with an output coupler having a plurality of output ports and, placed at the plurality of output ports, a plurality of respective photodetectors for measuring respective optical interference signals exiting the plurality of output ports when light is coupled from the light source into the AMZI, wherein the output coupler and the plurality of photodetectors are configured as a coherent receiver in which relative phase shifts imparted between two signals being interfered to form the optical interference signals differ between at least two of the output ports by a value that is not a multiple of 180°;
   creating an electronic control chip including memory and processing circuitry configured to compute a filter phase from the measured optical interference signals and tune a frequency of the light source until the computed filter phase matches a target filter phase corresponding to a specified locking frequency; and
   bonding the PIC and the electronic control chip to a common substrate to form the multi-chip integrated wavelength locker module.

18. The method of claim 17, further comprising calibrating the wavelength locker by:
   providing a reference signal having the specified locking frequency to an input of the AMZI,
   measuring optical interference signals at the plurality of photodetectors and output port of the AMZI and computationally converting the measured optical interference signals to a filter phase, and
   storing the filter phase as the target filter phase in memory.

19. The method of claim 18, wherein the reference signal is provided by an external light source.

20. The method of claim 18, wherein the reference signal is provided by the light source of the PIC following tuning of the light source to the specified locking frequency using an external wavelength filter.

* * * * *